United States Patent
Hsueh et al.

(10) Patent No.: US 11,804,488 B2
(45) Date of Patent: Oct. 31, 2023

(54) SEMICONDUCTOR DEVICE AND METHOD

(71) Applicant: Taiwan Semiconductor Manufacturing Co., Ltd., Hsinchu (TW)

(72) Inventors: Jen-Chih Hsueh, Kaohsiung (TW); Chih-Chang Hung, Hsinchu (TW); Tsung Fan Yin, Kaohsiung (TW); Yi-Wei Chiu, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/869,487

(22) Filed: Jul. 20, 2022

(65) Prior Publication Data

US 2022/0359505 A1    Nov. 10, 2022

Related U.S. Application Data

(63) Continuation of application No. 17/106,572, filed on Nov. 30, 2020, now Pat. No. 11,398,477, which is a continuation of application No. 16/424,865, filed on May 29, 2019, now Pat. No. 10,854,603.

(60) Provisional application No. 62/692,385, filed on Jun. 29, 2018.

(51) Int. Cl.
*H01L 27/088* (2006.01)
*H01L 21/8234* (2006.01)
*H01L 29/66* (2006.01)
*H01L 21/3213* (2006.01)
(Continued)

(52) U.S. Cl.
CPC ...... *H01L 27/0886* (2013.01); *H01L 21/0217* (2013.01); *H01L 21/31116* (2013.01);
(Continued)

(58) Field of Classification Search
None
See application file for complete search history.

(56) References Cited

U.S. PATENT DOCUMENTS 8,487,378 B2    7/2013  Goto et al.
8,729,634 B2    5/2014  Shen et al.
(Continued)

FOREIGN PATENT DOCUMENTS

CN    106158854 A    11/2016
CN    108122776 A    6/2018
(Continued)

*Primary Examiner* — Hsien Ming Lee
(74) *Attorney, Agent, or Firm* — Slater Matsil, LLP

(57) ABSTRACT

A method includes forming a first semiconductor fin and a second semiconductor fin in a substrate, the first semiconductor fin adjacent the second semiconductor fin, forming a dummy gate structure extending over the first semiconductor fin and the second semiconductor fin, depositing a first dielectric material surrounding the dummy gate structure, replacing the dummy gate structure with a first metal gate structure, performing an etching process on the first metal gate structure and on the first dielectric material to form a first recess in the first metal gate structure and a second recess in the first dielectric material, wherein the first recess extends into the substrate, and wherein the second recess is disposed between the first semiconductor fin and the second semiconductor fin, and depositing a second dielectric material within the first recess.

20 Claims, 40 Drawing Sheets

(51) Int. Cl.
*H01L 21/311* (2006.01)
*H01L 21/02* (2006.01)

(52) U.S. Cl.
CPC .......... *H01L 21/32135* (2013.01); *H01L 21/823431* (2013.01); *H01L 21/823481* (2013.01); *H01L 29/66545* (2013.01); *H01L 29/66492* (2013.01)

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 11,114,549 B2 | 9/2021 | Chen et al. |
| 2013/0313646 A1 | 11/2013 | Shieh et al. |
| 2014/0282326 A1 | 9/2014 | Chen et al. |
| 2015/0236131 A1 | 8/2015 | Chang et al. |
| 2016/0225764 A1 | 8/2016 | Chang et al. |
| 2016/0351568 A1 | 12/2016 | Chang et al. |
| 2016/0351700 A1 | 12/2016 | Chang et al. |
| 2017/0104087 A1 | 4/2017 | Chang et al. |
| 2017/0345820 A1 | 11/2017 | Lin et al. |
| 2018/0144988 A1 | 5/2018 | Liou et al. |
| 2018/0182859 A1 | 6/2018 | Lee et al. |
| 2019/0067277 A1 | 2/2019 | Tsai et al. |
| 2019/0378837 A1* | 12/2019 | Miao ........... H01L 21/76232 |

FOREIGN PATENT DOCUMENTS

| | | |
|---|---|---|
| CN | 108122983 A | 6/2018 |
| TW | I530989 B | 4/2016 |
| TW | I572035 B | 2/2017 |

\* cited by examiner

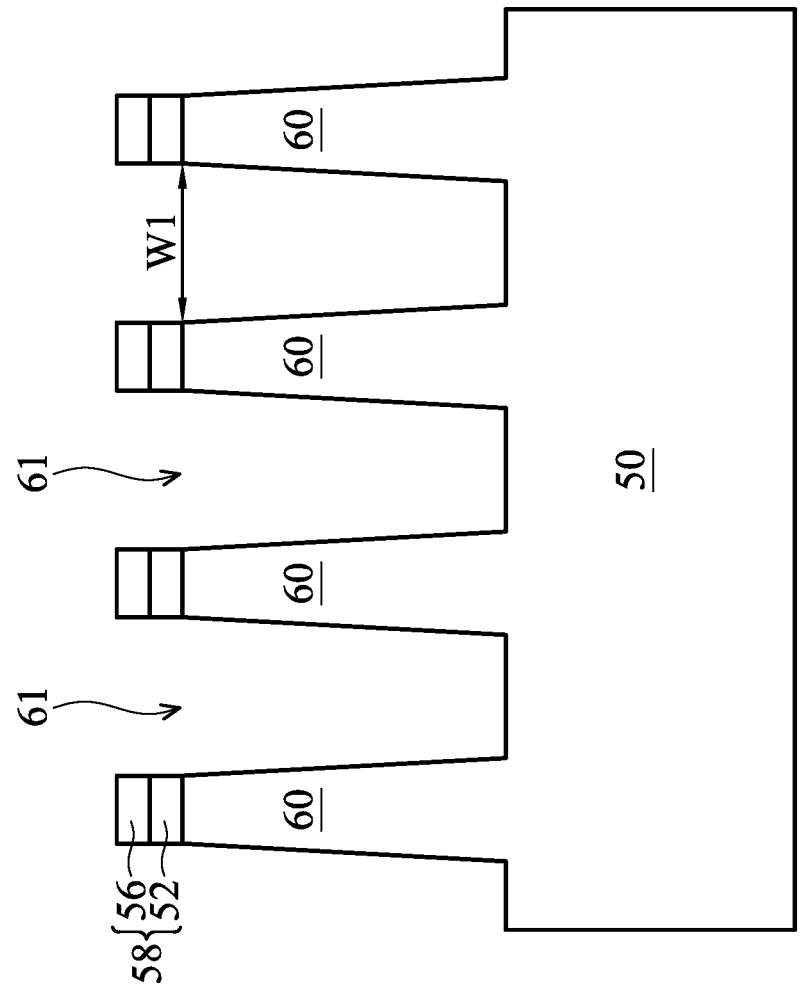

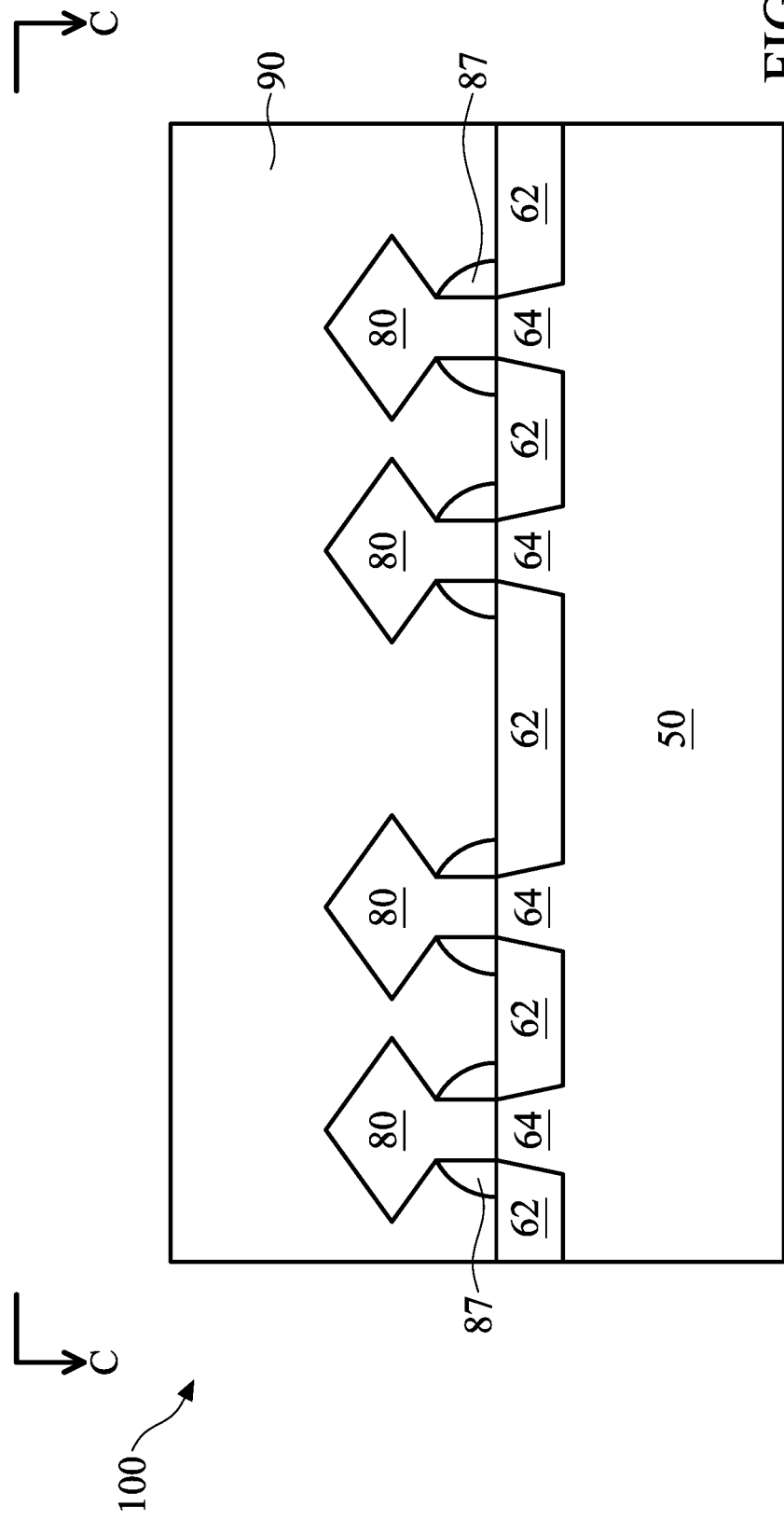

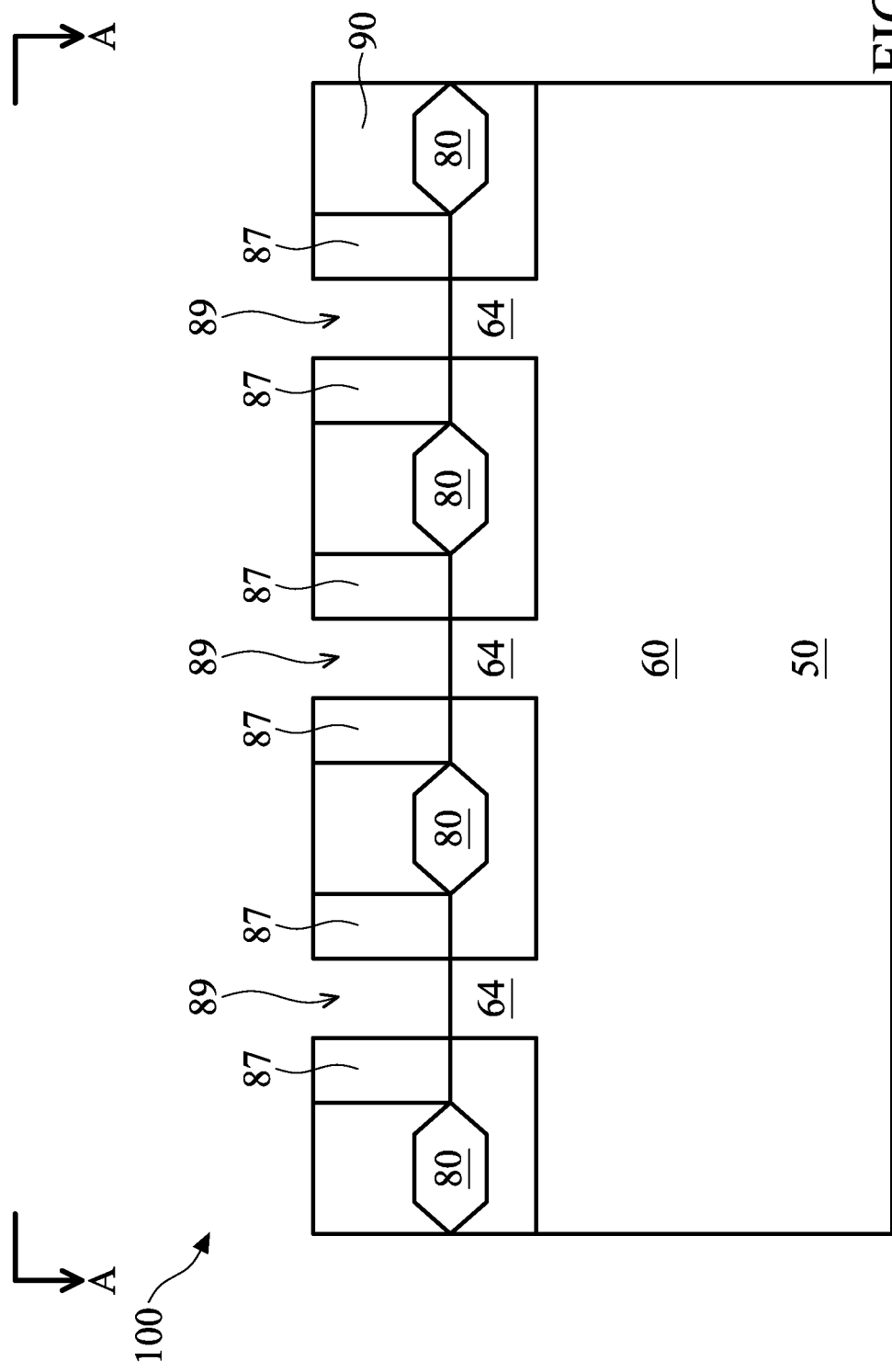

SEMICONDUCTOR DEVICE AND METHOD

PRIORITY CLAIM AND CROSS-REFERENCE

This application is a continuation of U.S. patent application Ser. No. 17/106,572 filed Nov. 30, 2020, now U.S. Pat. No. 11,398,477, issued Jul. 26, 2022, entitled "Semiconductor Device and Method," which is a continuation of U.S. patent application Ser. No. 16/424,865 filed May 29, 2019, now U.S. Pat. No. 10,854,603 issued Dec. 1, 2020, entitled "Semiconductor Device and Method," which claims priority to U.S. Provisional Patent Application No. 62/692,385 filed Jun. 29, 2018, entitled "Semiconductor Device and Method," each application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, techniques for isolating metal gates of a FinFET device. Various embodiments presented herein are discussed in the context of FinFETs formed using a gate-last process. In other embodiments, a gate-first process may be used. The fins of a FinFET device may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers may be formed alongside the patterned sacrificial layer using a self-aligned process. The sacrificial layer is then removed, and the remaining spacers, or mandrels, may then be used to pattern the fins.

Figure 1:
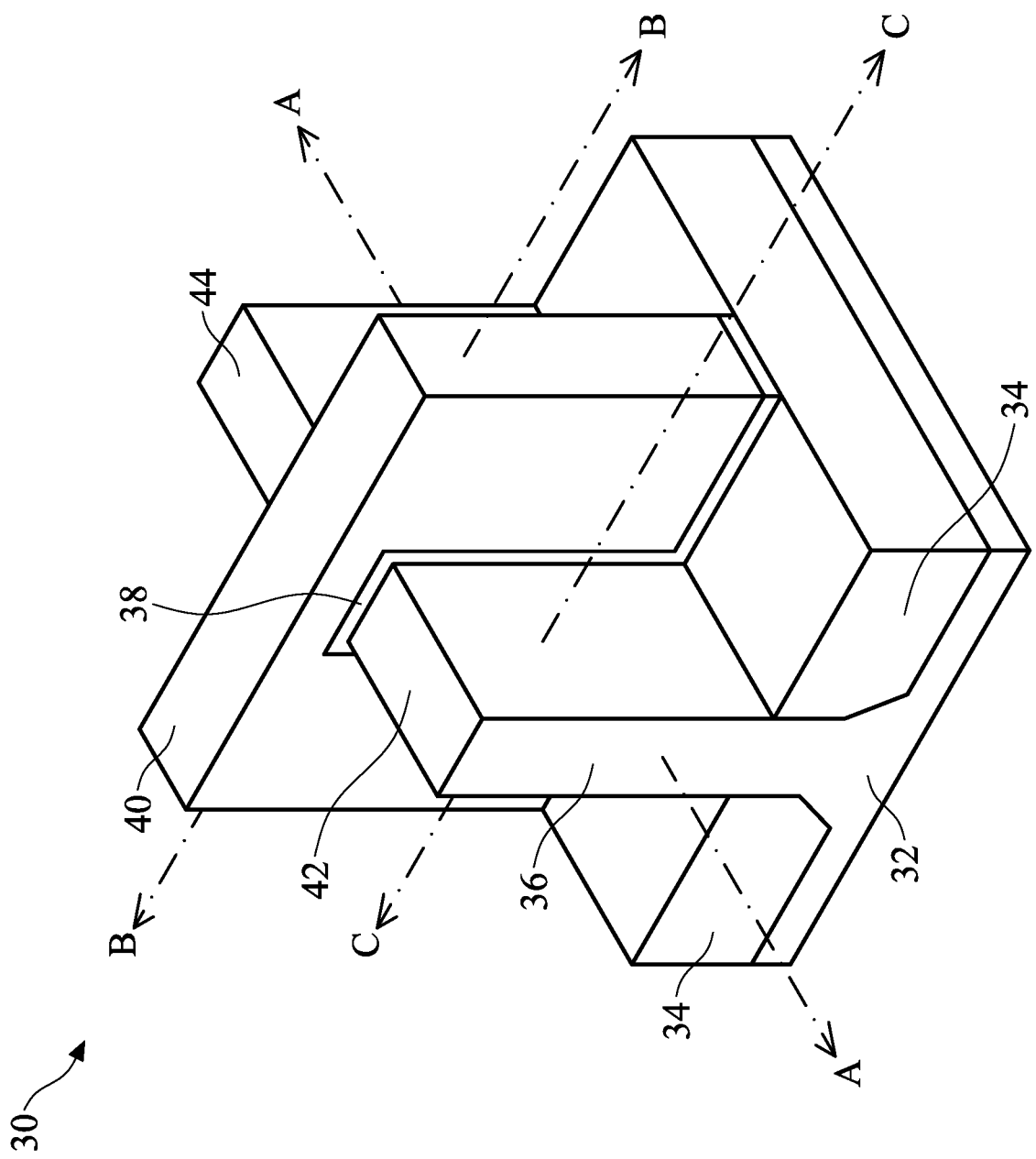
FIG. 1 is a perspective view of a Fin Field-Effect Transistor (FinFET), in accordance with some embodiments.

FIG. 1 illustrates an example of a fin field-effect transistor (FinFET) 30 in a three-dimensional view. The FinFET 30 includes a fin 36 on a semiconductor substrate 32. The fin 36 protrudes above and from between neighboring isolation regions 34, which are disposed over portions of the semiconductor substrate 32. A gate dielectric 38 is along sidewalls and over a top surface of the fin 36, and a gate fill 40 is over the gate dielectric 38. Source/drain regions 42 and 44 are disposed in opposite sides of the fin 36 with respect to the gate dielectric 38 and gate fill 40. FIG. 1 further illustrates reference cross-sections that are used in later figures. Cross-section B-B extends along a longitudinal axis of the gate fill 40 of the FinFET 30. Cross-section A-A is perpendicular to cross-section B-B and is along a longitudinal axis of the fin 36 and in a direction of, for example, a current flow between the source/drain regions 42 and 44. Subsequent figures refer to these reference cross-sections for clarity.

FIGS. 2-19 illustrate various views (e.g., cross-sectional views or plan views) of a FinFET device 100 at various stages of fabrication in accordance with some embodiments. The FinFET device 100 is similar to the FinFET 30 in FIG. 1, except for multiple fins and multiple gate structures. For reference, each of FIGS. 2-19 showing a cross-sectional view is labeled with its respective cross-section.

Figure 2:
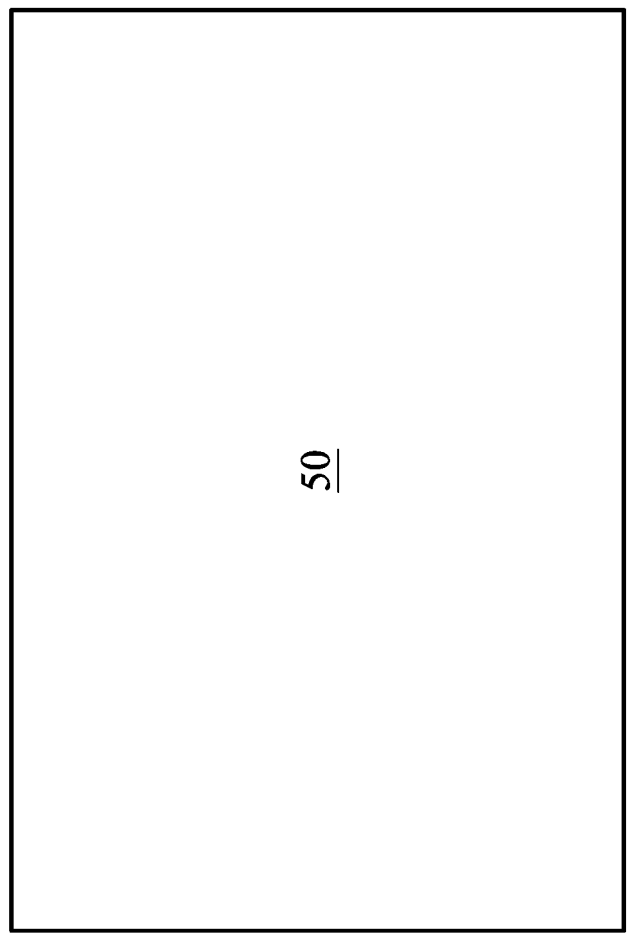
FIGS. 2-11C illustrate various views (e.g., cross-sectional views, plan views) of a FinFET device at various stages of fabrication, in accordance with an embodiment.

FIG. 2 illustrates a cross-sectional view of a substrate 50 along cross-section B-B. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon, germanium, a compound semiconductor such as silicon carbide, gallium arsenic, gallium phosphide, indium phosphide, indium arsenide, indium antimonide, or the like, an alloy semiconductor such as SiGe, GaAsP, AlInAs, AlGaAs, GaInAs, GaInP, GaInAsP, or the like, another kind of semiconductor material, or combinations thereof.

Referring to FIG. 3A, the substrate 50 shown in FIG. 2 is patterned using, for example, photolithography and etching techniques. For example, a mask layer, such as a pad oxide layer 52 and an overlying pad nitride layer 56, may be formed over the substrate 50. The pad oxide layer 52 may be a thin film including silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbide, silicon carbonitride, the like, or a combination thereof. The pad nitride layer 56 may be formed using low-pressure chemical vapor deposition (LPCVD) process, a plasma enhanced chemical vapor deposition (PECVD) process, or using another process.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58. As illustrated in FIG. 3A, the patterned mask 58 includes patterned pad oxide 52 and patterned pad nitride 56.

The patterned mask 58 is subsequently used to pattern exposed portions of the substrate 50 to form trenches 61, thereby defining semiconductor strips 60 between adjacent trenches 61 as illustrated in FIG. 3A. In some embodiments, the semiconductor strips 60 are formed by etching trenches 61 in the substrate 50 using, for example, reactive ion etch (RIE), neutral beam etch (NBE), the like, or a combination thereof. The etch may be anisotropic. In some embodiments, the trenches 61 may be strips (in a plan view) parallel to each other, and closely spaced with respect to each other. In some embodiments, the trenches 61 may be continuous and surround the semiconductor strips 60. After semiconductor strips 60 are formed, the patterned mask 58 may be removed by etching or any suitable method. In some embodiments, the tops of adjacent semiconductor strips 60 may be separated by a width W1 that is between about 30 nm and about 50 nm, such as about 15-20 nm.

Figure 3B:
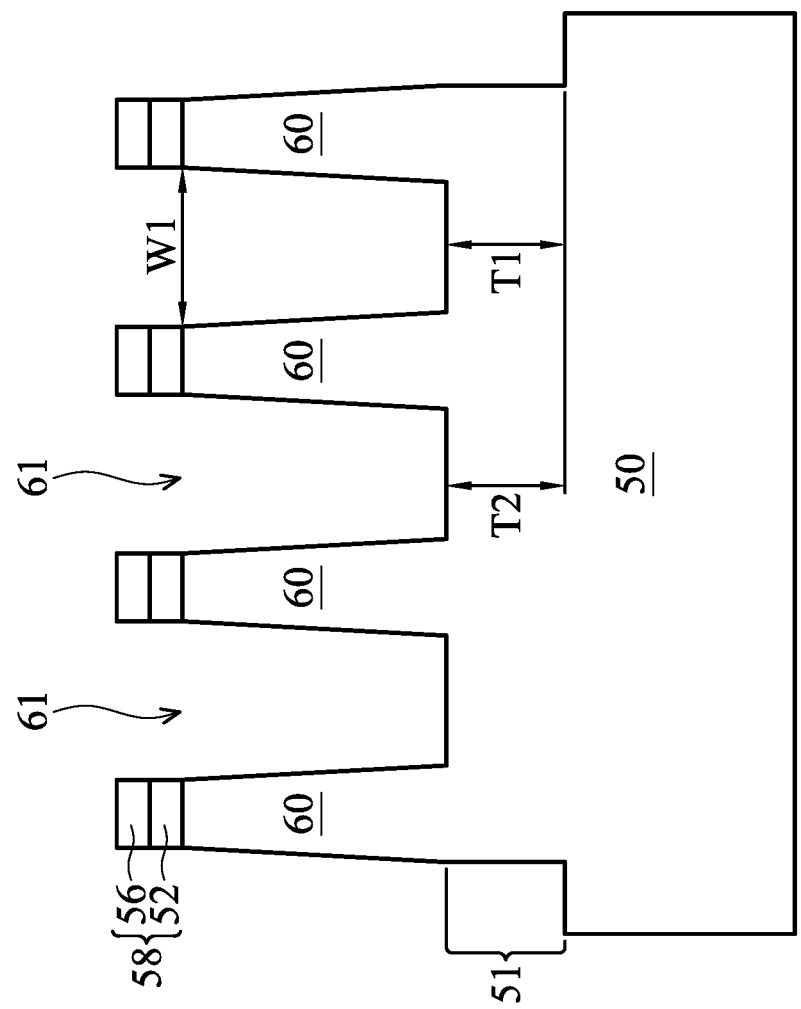

FIG. 3B illustrates an exemplary embodiment in which the semiconductor strips 60 are formed over a crown structure 51 which protrudes from the substrate 50. The crown structure 51 may be formed by recessing substrate 50 using photolithographic techniques. In some embodiments, the crown structure 51 may have different thicknesses between different sets of fins 64. For example, the thickness T2 shown in FIG. 3B may be different from the thickness T1 shown in FIG. 3B. In some embodiments, thickness T1 is between about 1 nm and about 30 nm and thickness T2 is between about 1 nm and about 30 nm. Thickness T1 may also be about the same as thickness T2 in some embodiments. In some embodiments, a height of a strip 60 measured from the recessed substrate 50 may be greater than or about the same as a height of a strip 60 measured from a portion of the crown structure 51 having thickness T2, and/or a height of a strip 60 measured from a portion of the crown structure 51 having thickness T2 may be greater than or about the same as a height of a strip 60 measured from a portion of the crown structure 51 having thickness T1. In some embodiments, a height of a strip 60 measured from the recessed substrate 50 may be greater than or about the same as about 100 nm. In some embodiments, a height of a strip 60 measured from a portion of the crown structure 51 having thickness T1 may be greater than or about the same as about 100 nm, and a height of a strip 60 measured from a portion of the crown structure 51 having thickness T1 may be greater than or about the same as about 110 nm. While FIG. 3B shows four strips 60 formed over the crown structure 51, more or fewer strips 60 may be formed over a crown structure 51. In some cases, a metal gate cut may be located over the crown structure 51, described in greater detail below with respect to FIG. 19.

Figure 4:
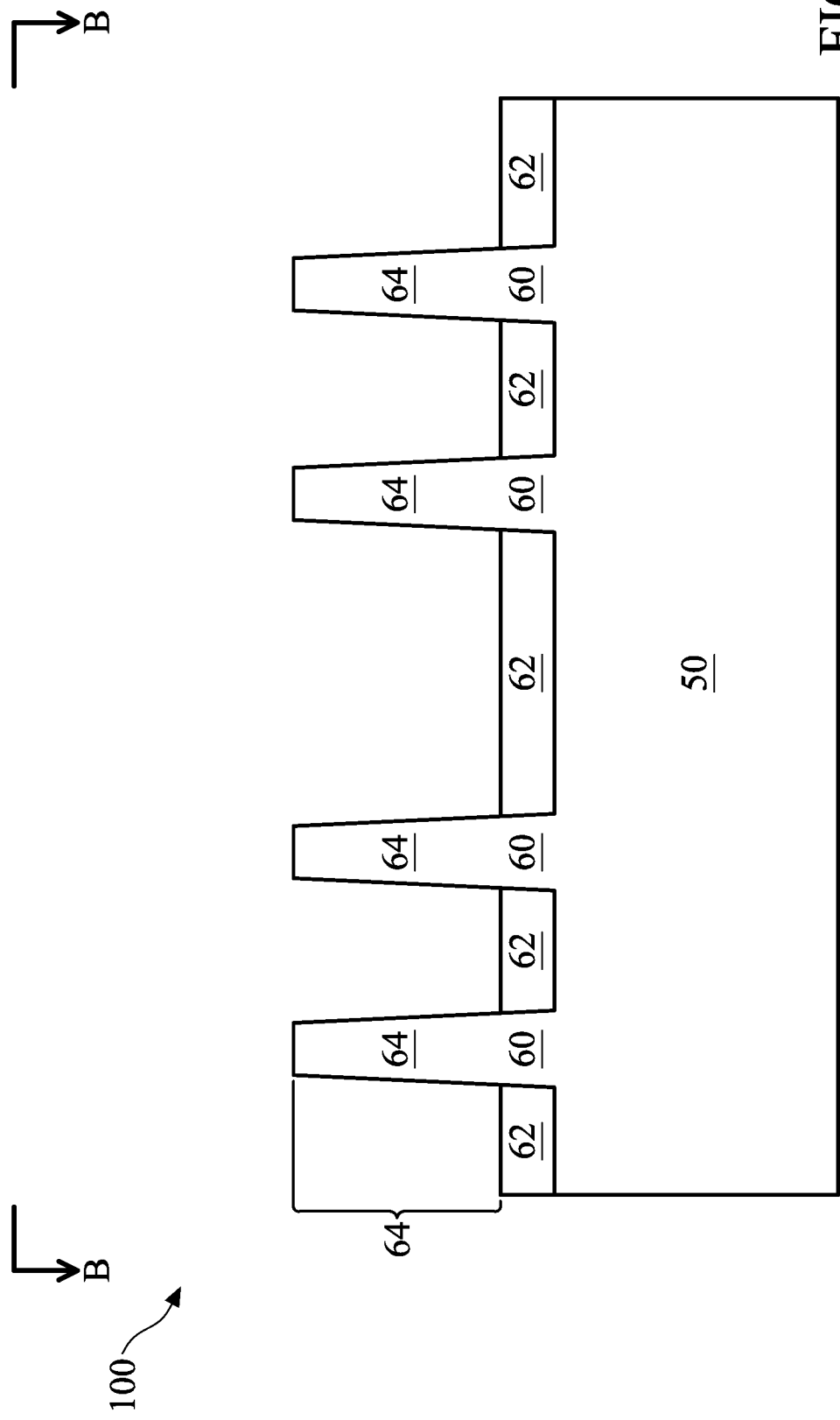
Figure 5A:
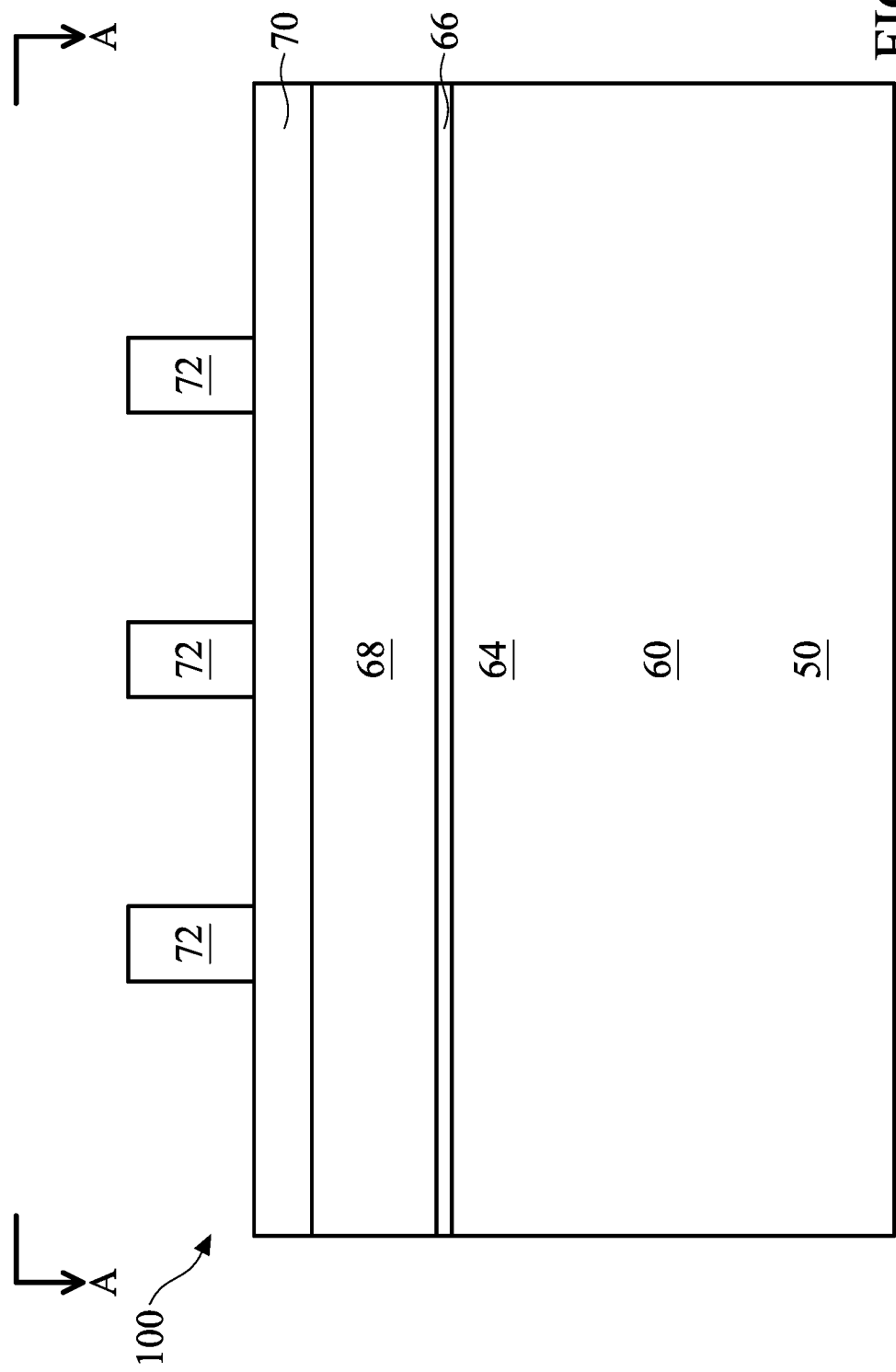
Figure 5B:
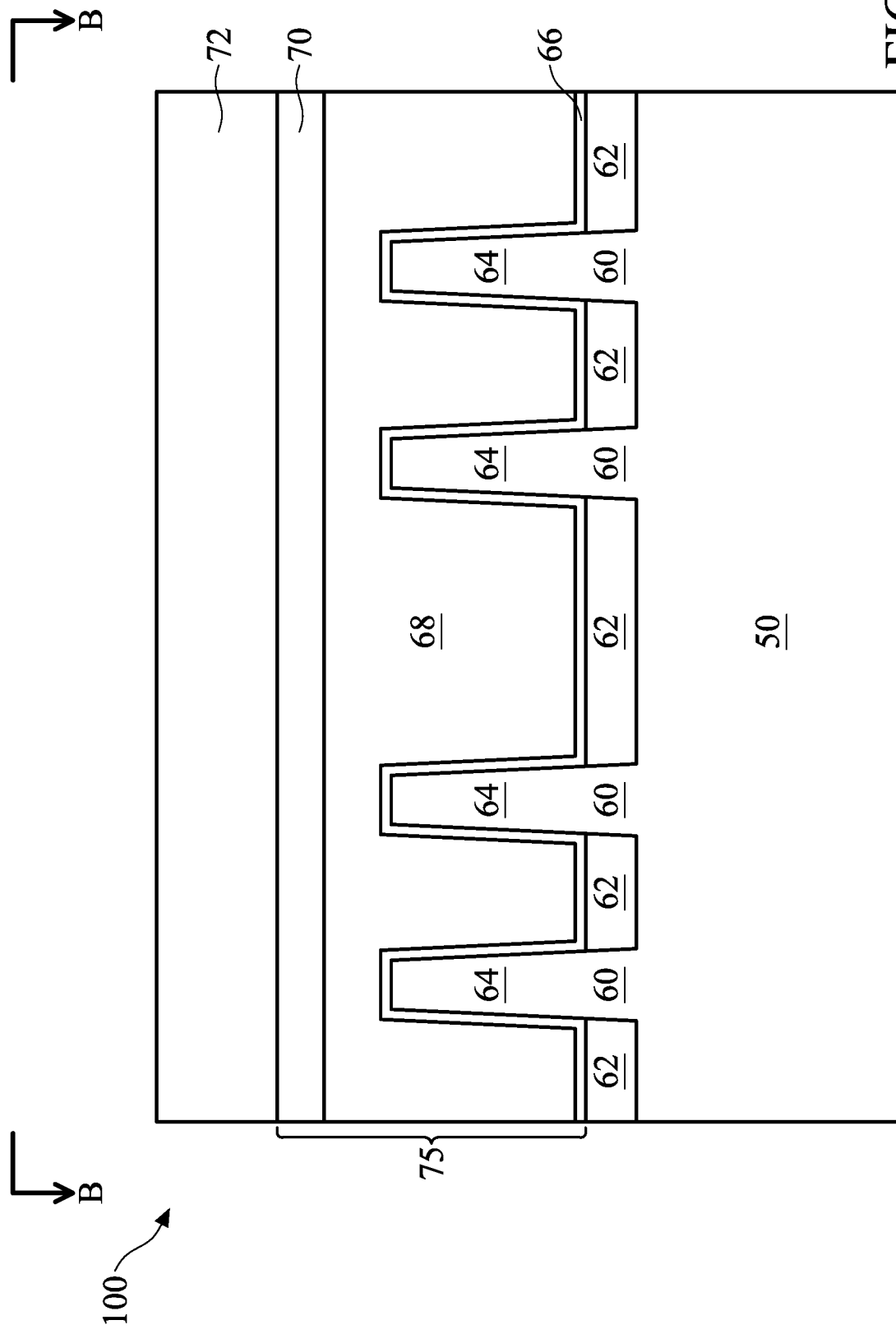

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. An anneal process may be performed once the insulation material is formed. A planarization process, such as a chemical mechanical polish (CMP) process, may remove any excess insulation material (and, if present, the patterned mask 58) and form top surfaces of the isolation regions 62 and top surfaces of the semiconductor strips 60 that are coplanar (not shown).

In some embodiments, the isolation regions 62 include a liner, e.g., a liner oxide (not shown), at the interface between the isolation region 62 and the substrate 50/semiconductor strip 60. In some embodiments, the liner oxide is formed to reduce crystalline defects at the interface between the substrate 50 and the isolation region 62. Similarly, the liner oxide may also be used to reduce crystalline defects at the interface between the semiconductor strip 60 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed such that the upper portions of the semiconductor strips 60 protrude from between neighboring isolation regions 62 and form semiconductor fins 64 (also referred to as fins 64). The recessed isolation regions 62 may be shallow trench isolation (STI) regions in some embodiments. The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. In some cases, the isolation regions 62 may be recessed using a dry etch, and the dry etch may use an etching gas such as ammonia, hydrogen fluoride, another etching gas, or a combination of etching gases. Other suitable etching processes may also be used to recess the isolation regions 62.

FIGS. 2 through 4 illustrate an embodiment of forming fins 64, but fins may be formed in various different processes. In one example, a dielectric layer can be formed over a top surface of a substrate and trenches can be etched through the dielectric layer. Homoepitaxial structures can be epitaxially grown in the trenches or heteroepitaxial structures can be epitaxially grown in the trenches using a material different from the substrate. The dielectric layer can then be recessed such that the homoepitaxial structures or heteroepitaxial structures protrude from the dielectric layer to form the fins. In other embodiments, heteroepitaxial structures can be used for the fins. For example, the semiconductor strips can be recessed, and a material different from the semiconductor strips may be epitaxially grown in their place.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

FIGS. 5A-5B and FIGS. 6A-6B illustrate steps of forming dummy gate structures 75 over the semiconductor fins 64. The example dummy gate structures 75 include a dummy gate dielectric 66, a dummy gate fill 68, and a mask 70. To form the dummy gate structures 75, a dielectric material is first formed over the semiconductor fins 64 and the isolation regions 62. The dummy gate dielectric 66 will subsequently be formed from the dielectric material. The dielectric material may be, for example, silicon oxide, silicon nitride, multilayers thereof, or the like, and may be deposited or thermally grown according to acceptable techniques. In some embodiments, the dielectric material may be a high-k dielectric material, and in these embodiments, the dielectric material may have a k value greater than about 7.0, and may include a metal oxide or a silicate of Hf, Al, Zr, La, Mg, Ba, Ti, Pb, multilayers thereof, or combinations thereof. The formation methods of dielectric material may include molecular-beam deposition (MBD), atomic layer deposition (ALD), plasma-enhanced CVD (PECVD), and the like.

A dummy gate material is then formed over the dummy gate dielectric material, and a mask layer is formed over the gate material. The dummy gate fill 68 and mask 70 are subsequently formed from the dummy gate material and the mask layer, respectively. The dummy gate material may be deposited over the dielectric material and then planarized, such as by a CMP process. The mask layer may then be deposited over the planarized dummy gate material. In some embodiments, the dummy gate material may be formed of polysilicon, although other materials may also be used. In some embodiments, the dummy gate material may include a metal-containing material such as TiN, TaN, TaC, Co, Ru, Al, combinations thereof, or multi-layers thereof. In some embodiments, the mask layer may be a hardmask, and may be formed of silicon nitride, although other materials may also be used.

Figure 6A:
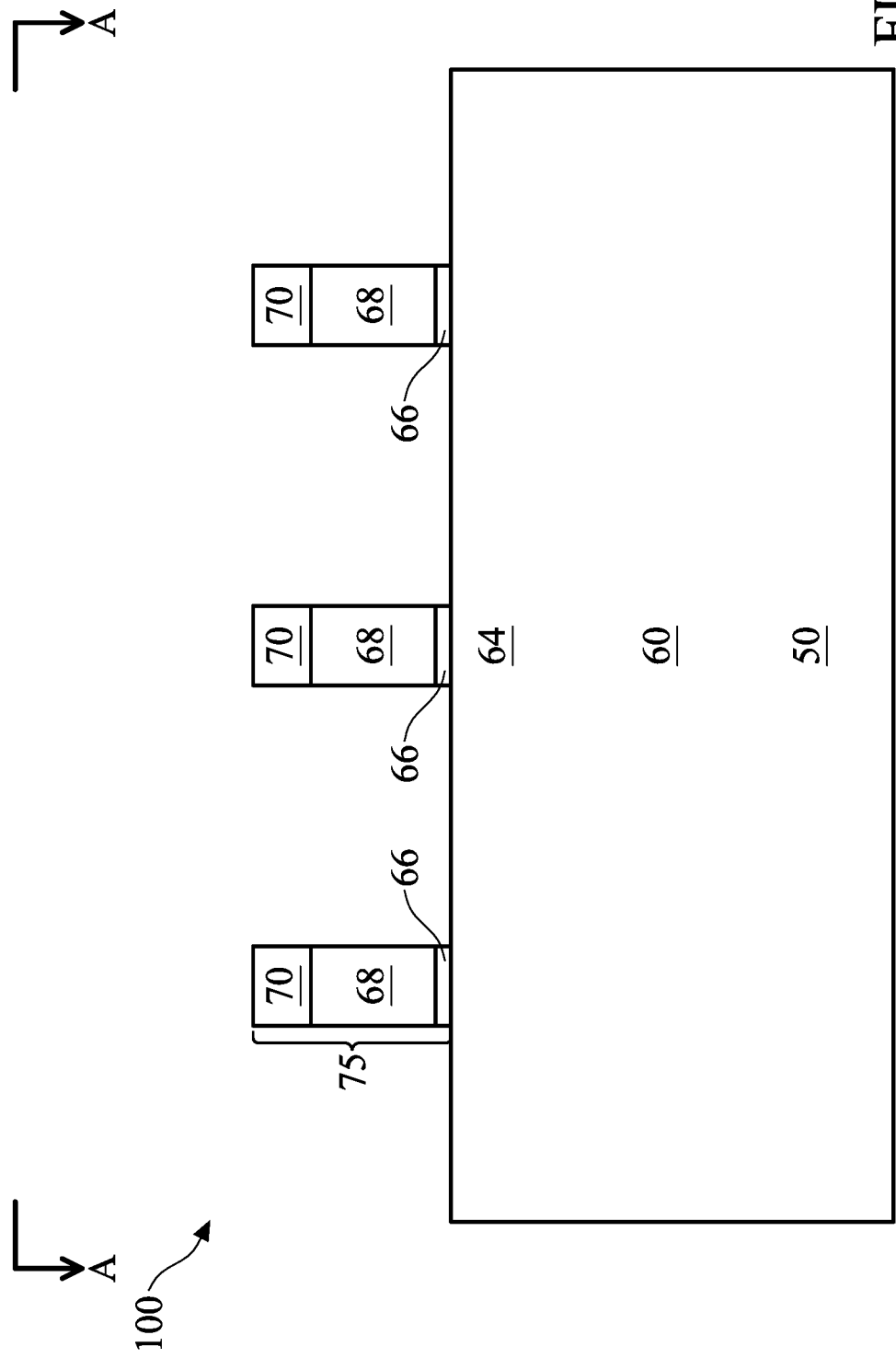
Figure 6B:
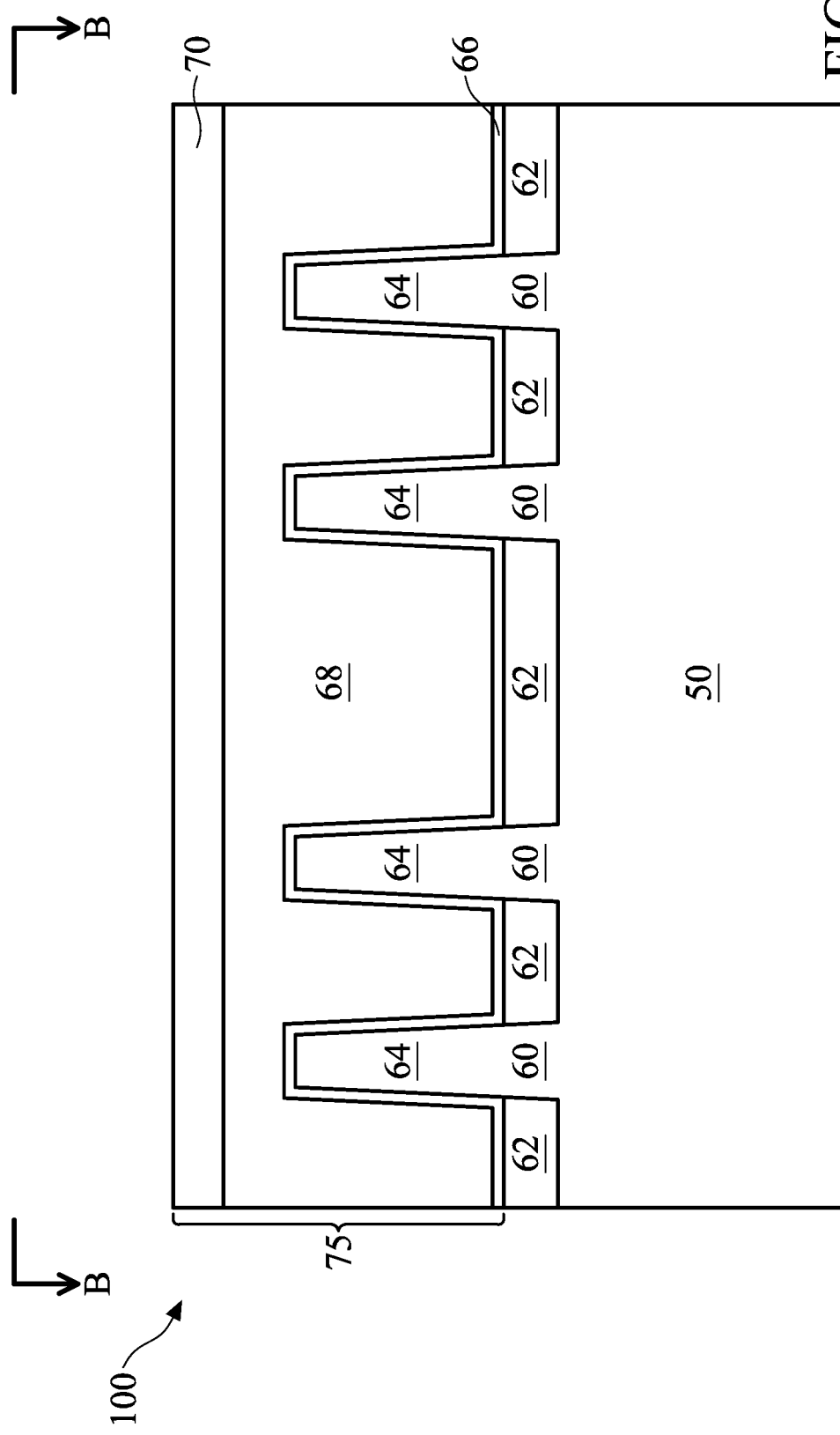

After the dielectric material, the dummy gate material, and the mask layer are formed, the mask layer may be patterned using acceptable photolithography and etching techniques to form mask 70. For example, a photoresist 72 may be formed over the mask layer and patterned using photolithographic techniques, resulting in the example structure shown in FIGS. 5A-5B. The pattern of photoresist 72 then may be transferred to the mask layer by a suitable etching technique to form mask 70. The pattern of the mask 70 then may be transferred to the dummy gate material and the dielectric layer by a suitable etching technique to form dummy gate fill 68 and dummy gate dielectric 66, respectively. An example resulting structure is shown in FIGS. 6A-6B. The dummy gate fill 68 and dummy gate dielectric 66 cover respective channel regions of the semiconductor fins 64. The dummy gate fill 68 may also have a lengthwise direction substantially perpendicular to the lengthwise direction of respective semiconductor fins 64. Although three gate structures 75 are illustrated over a semiconductor fin 64 in the cross-sectional view of FIGS. 6A-6B, more or fewer gate structures 75 may be formed over a semiconductor fin 64.

Figure 7A:
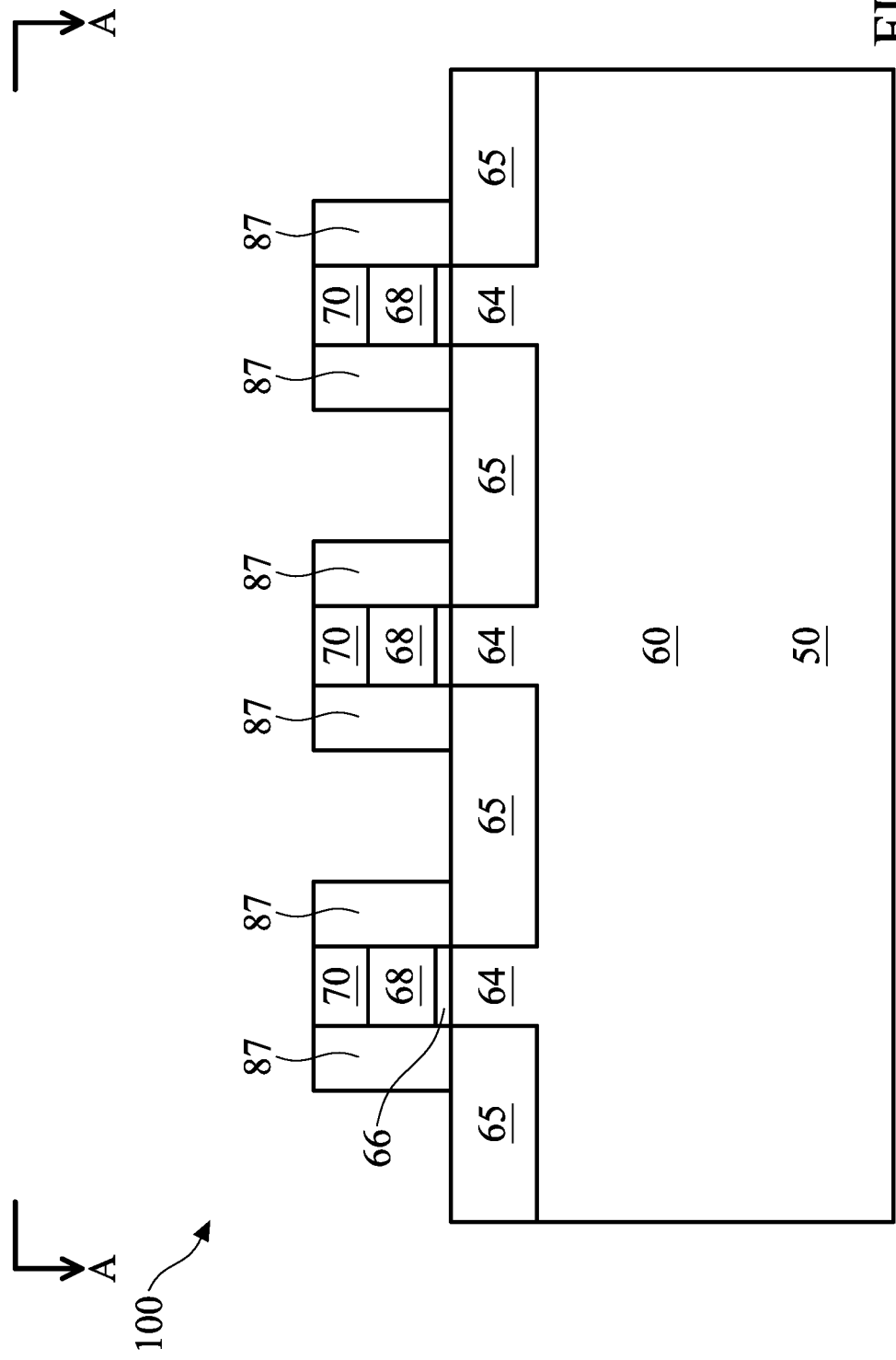
Figure 7B:
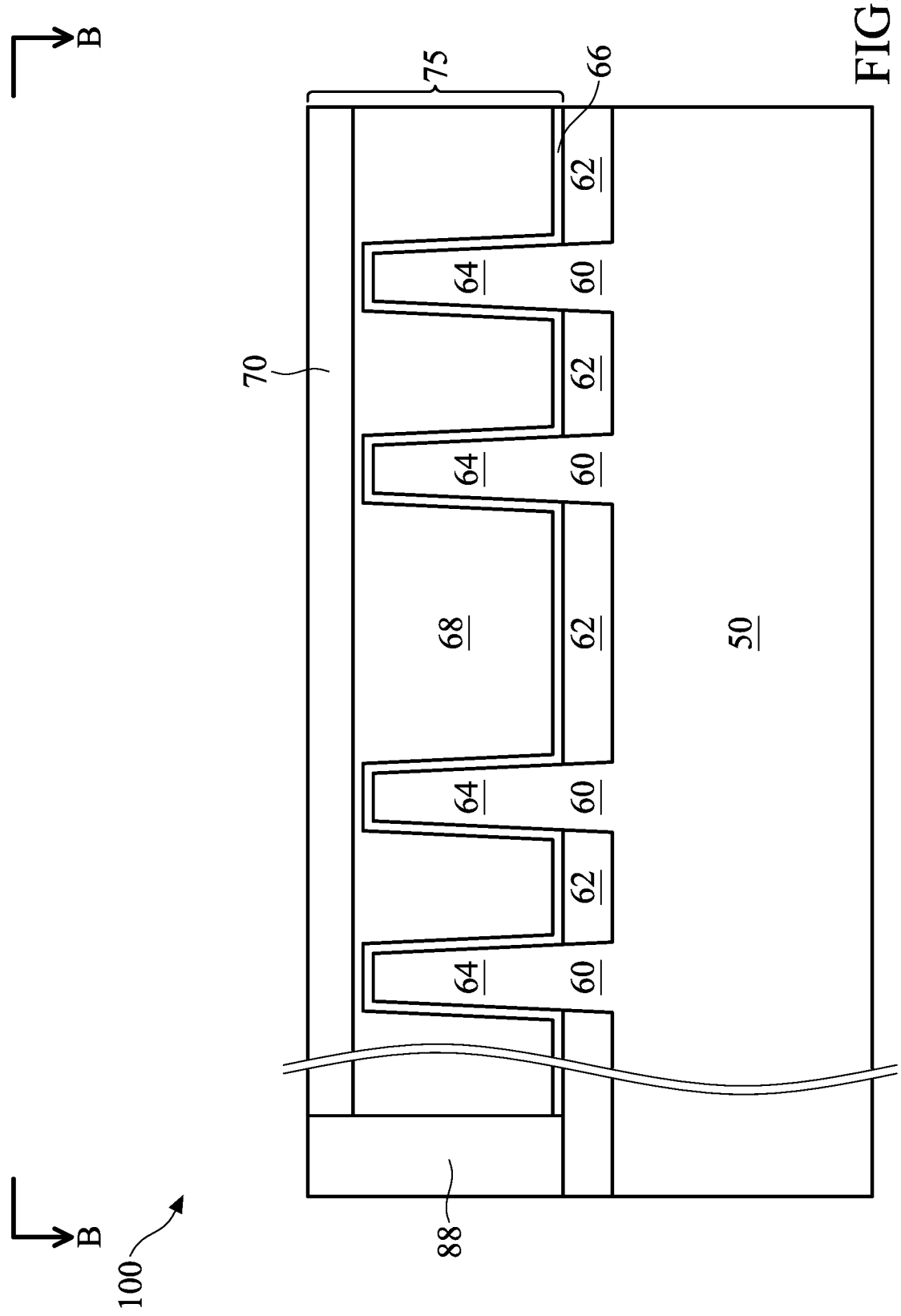

Turning to FIGS. 7A-7B, lightly doped drain (LDD) regions 65 are formed in the semiconductor fins 64. The LDD regions 65 may be formed by an implantation process. The implantation process may implant N-type or P-type impurities in the semiconductor fins 64 to form the LDD regions 65. In some embodiments, the LDD regions 65 abut the channel region of the FinFET device 100. Portions of the LDD regions 65 may extend under gate 68 and into the channel region of the FinFET device 100. FIG. 7A illustrates a non-limiting example of the LDD regions 65. Other configurations, shapes, and formation methods of the LDD regions 65 are also possible and are fully intended to be included within the scope of the present disclosure. For example, LDD regions 65 may be formed after spacers 87 are formed in other embodiments.

After the LDD regions 65 are formed, spacers 87 are formed on the gate structures 75. In the example of FIGS. 7A-7B, the spacers 87 are formed on opposing sidewalls of the gate 68 and on opposing sidewalls of the gate dielectric 66. The spacers 87 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The spacers 87 may also extend over the upper surface of the semiconductor fins 64 and the upper surface of the isolation region 62. Spacers 87 are also formed on end sidewalls of the gate structures 75, and an example spacer 87 is shown in FIG. 7B as end spacer 88. End spacers 88 have been omitted from some subsequent Figures for clarity, but may be present.

The shapes and formation methods of the spacers 87 as illustrated in FIG. 7A are merely non-limiting examples, and other shapes and formation methods are possible. For example, the spacers 87 may include first spacers (not shown) and second spacers (not shown). The first spacers may be formed on opposing sidewalls of the gate structures 75. The second spacers may be formed on the first spacers, with the first spacers disposed between a respective structure 75 and the respective second spacers. In some cases, the first spacers may have an "L-shape" in a cross-sectional view. As another example, the spacers 87 may be formed after the epitaxial source/drain regions 80 (see FIGS. 8A-8D) are formed. In some embodiments, dummy spacers are formed on the first spacers (not shown) before the epitaxial process of the epitaxial source/drain regions 80 illustrated in FIGS. 8A-8D, and the dummy spacers are removed and replaced with the second spacers after the epitaxial source/drain regions 80 are formed. All such embodiments are fully intended to be included in the scope of the present disclosure.

Figure 8A:
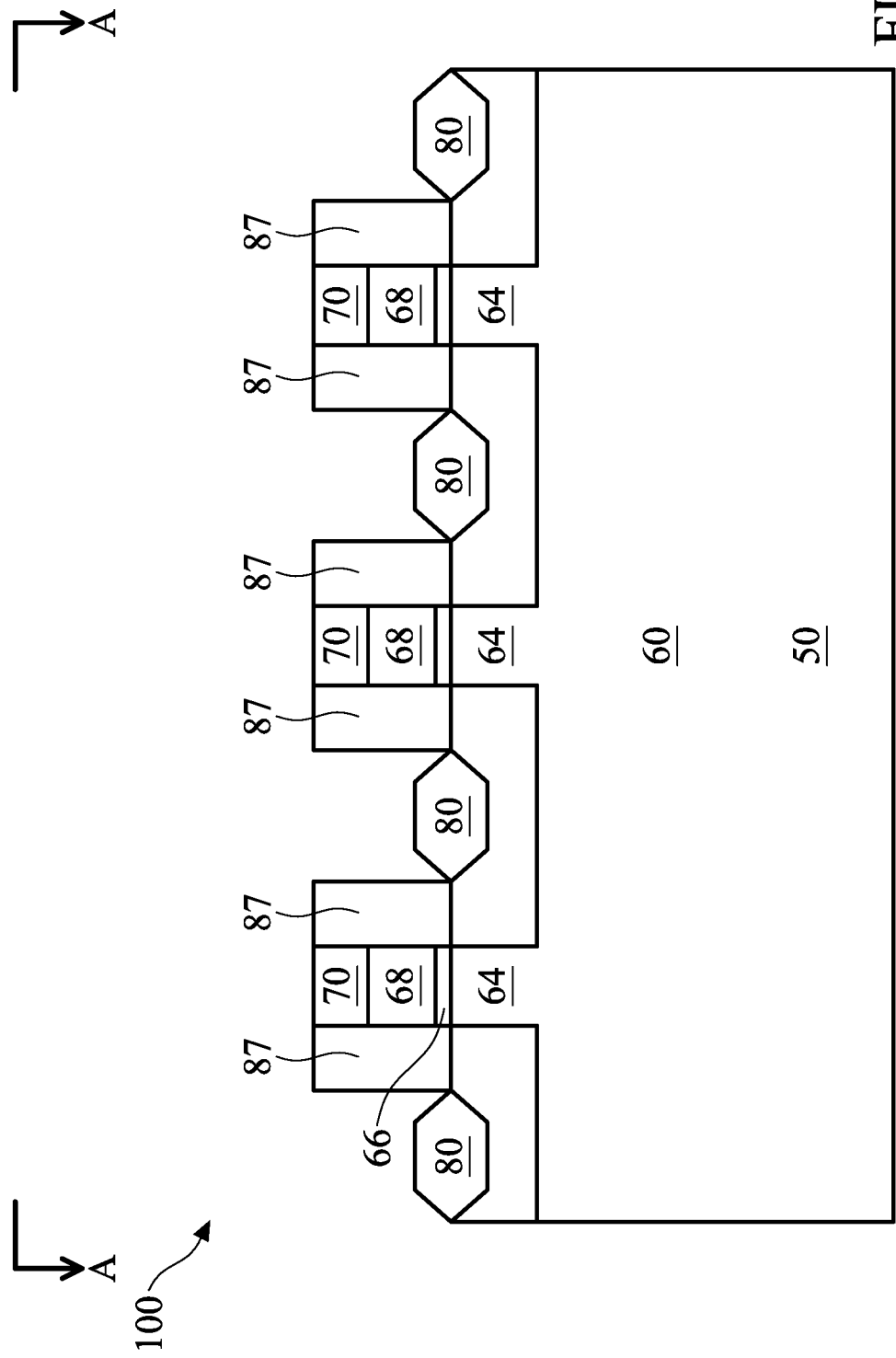
Figure 8B:
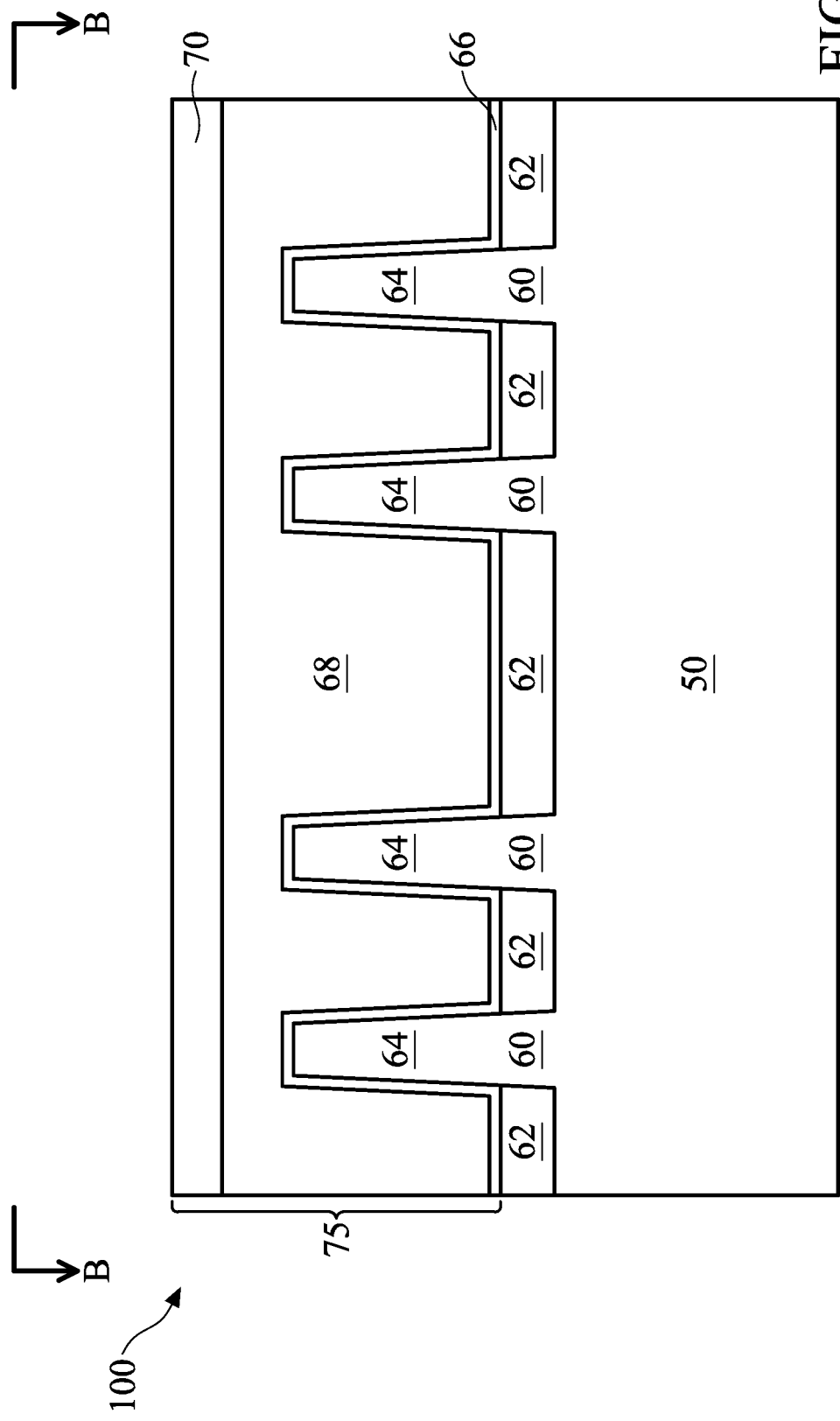
Figure 8C:
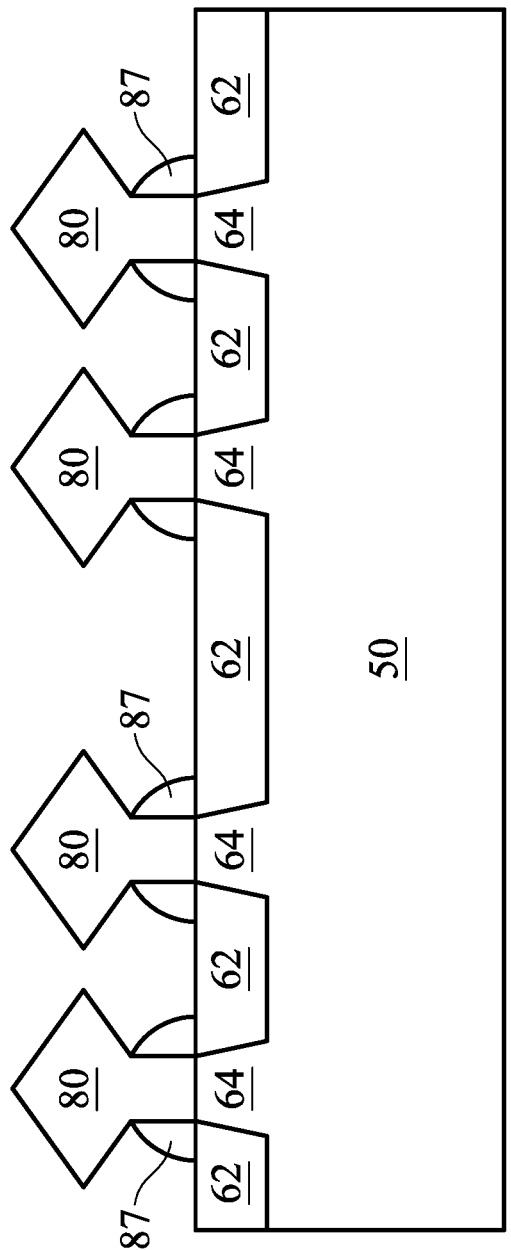
Figure 8D:
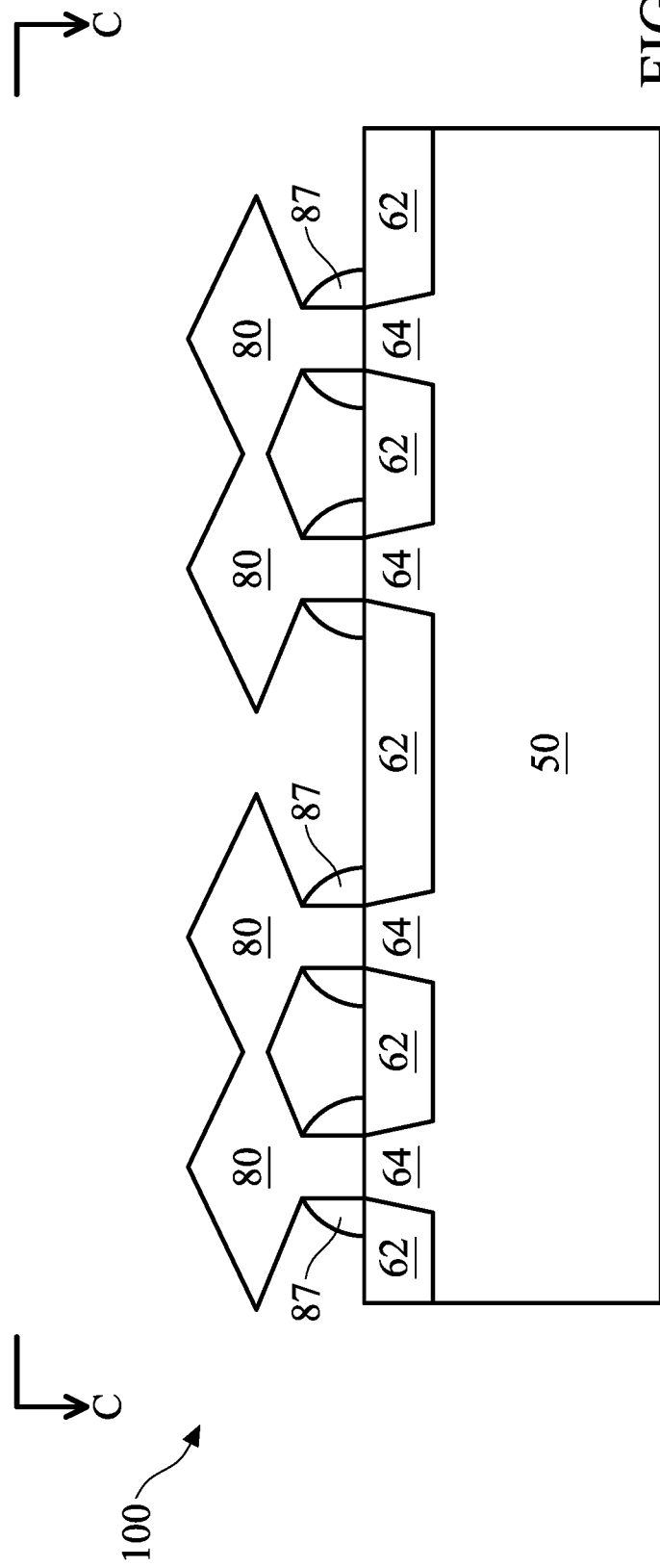

Next, as illustrated in FIGS. 8A-8D, source/drain regions 80 are formed. The source/drain regions 80 are formed by etching the fins 64 to form recesses, and epitaxially growing material in the recess. The epitaxial material of the source/drain regions 80 may be grown using suitable methods such as metal-organic CVD (MOCVD), molecular beam epitaxy (MBE), liquid phase epitaxy (LPE), vapor phase epitaxy (VPE), selective epitaxial growth (SEG), another process, or a combination thereof. As shown in FIGS. 8C-D, material of the spacers 87 may be present adjacent the source/drain regions 80.

As illustrated in FIG. 8A, the source/drain regions 80 may protrude above upper surfaces of the fins 64. In some cases, the source/drain regions 80 may have facets or may have irregular shapes. In some embodiments, the source/drain regions 80 of adjacent fins 64 do not merge together and remain separate source/drain regions 80, as shown in FIG. 8C and in FIGS. 9C-17B. In some embodiments, the source/drain regions 80 of adjacent fins 64 may merge to form a continuous epitaxial source/drain region 80, as shown in the exemplary embodiment of FIG. 8D. In some embodiments in which the resulting FinFET is an n-type FinFET, source/drain regions 80 may include silicon carbide (SiC), silicon phosphorous (SiP), phosphorous-doped silicon carbon (SiCP), or the like. In some embodiments in which the resulting FinFET is a p-type FinFET, source/drain regions 80 may include silicon germanium (SiGe) and may include a p-type impurity such as boron (B) or indium (In).

In some embodiments, epitaxial source/drain regions 80 may be implanted with dopants. The implanting process may include forming and patterning masks such as a photoresist to cover the regions of the FinFET that are to be protected from the implanting process. In some embodiments, portions of the source/drain regions 80 may have a dopant concentration range between about 1E19 $cm^{-3}$ and about 1E21 $cm^{-3}$. In some embodiments, the epitaxial source/drain regions 80 may be in situ doped during epitaxial growth.

Next, as illustrated in FIGS. 9A-11C, a first interlayer dielectric (ILD) 90 is formed over the structure illustrated in FIGS. 8A-8C, and a gate-last process (sometimes referred to as replacement gate process) is performed. In a gate-last process, the dummy gate 68 and the dummy gate dielectric 66 are dummy structures that are removed and replaced with an active gate and active gate dielectric, which may be collectively referred to as a replacement gate or a metal gate structure (such a replacement gate 97 shown in FIGS. 11A-11B).

Figure 9A:
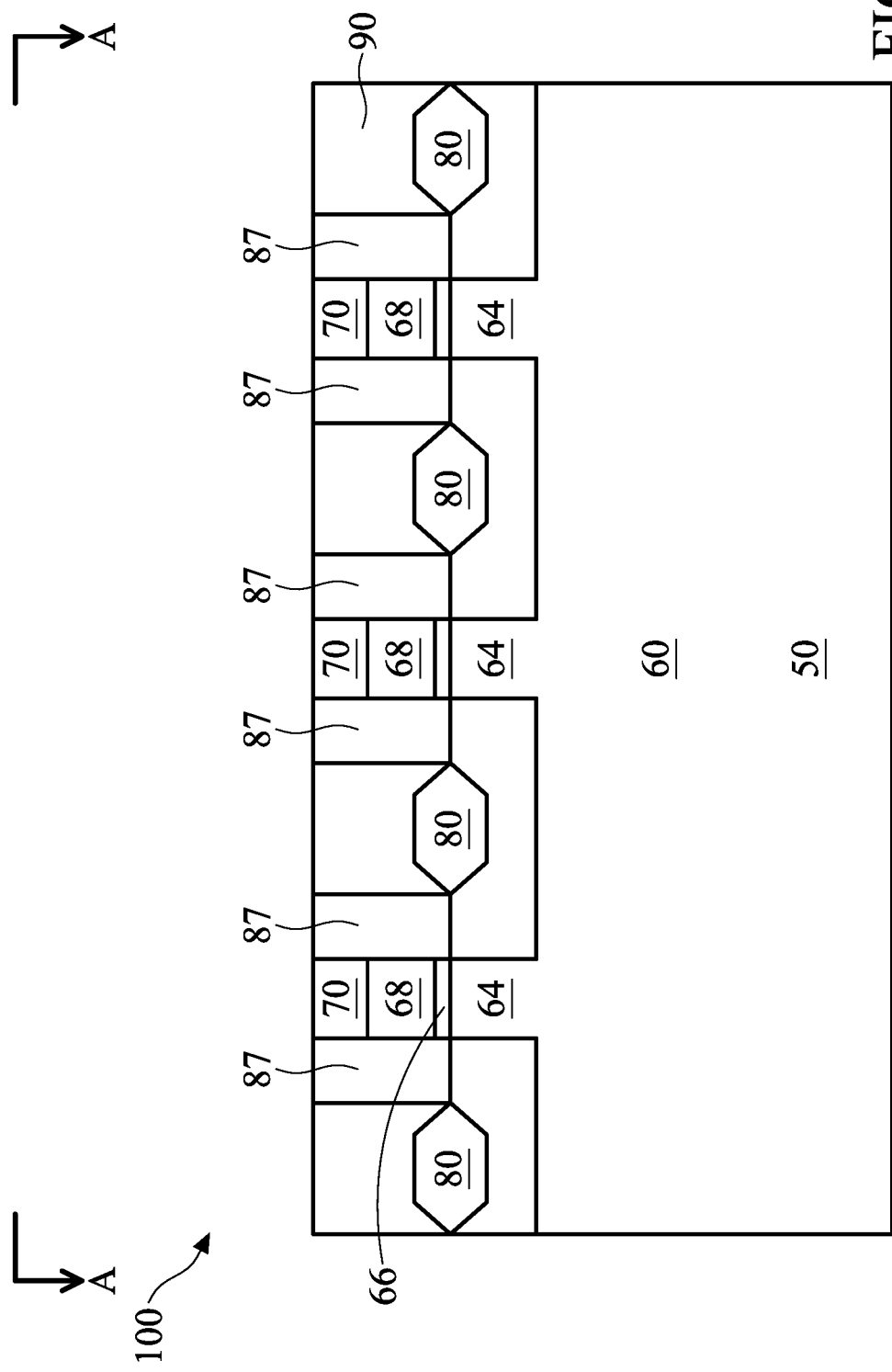
Figure 9B:
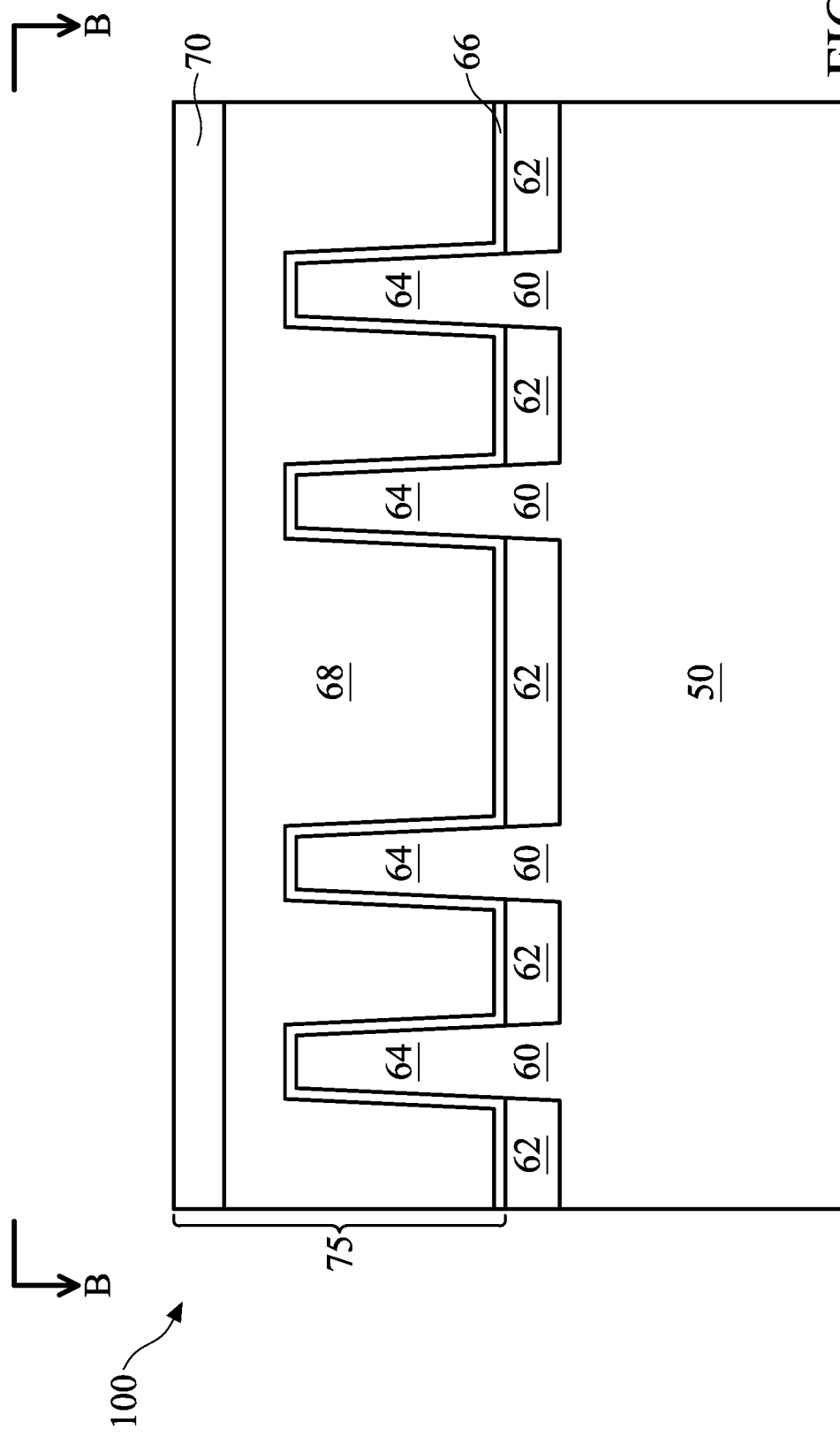

In FIGS. 9A-9C, the first ILD 90 is formed. In some embodiments, the first ILD 90 is formed of a dielectric material such as silicon oxide (SiO), phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to planarize the top surface of the first ILD 90, as shown in FIGS. 9A-9C. In some embodiments, some or all of the mask 70 is removed by the CMP process. In some embodiments, a top surface of the dummy gate fill 68 is exposed after the CMP process.

Figure 10B:
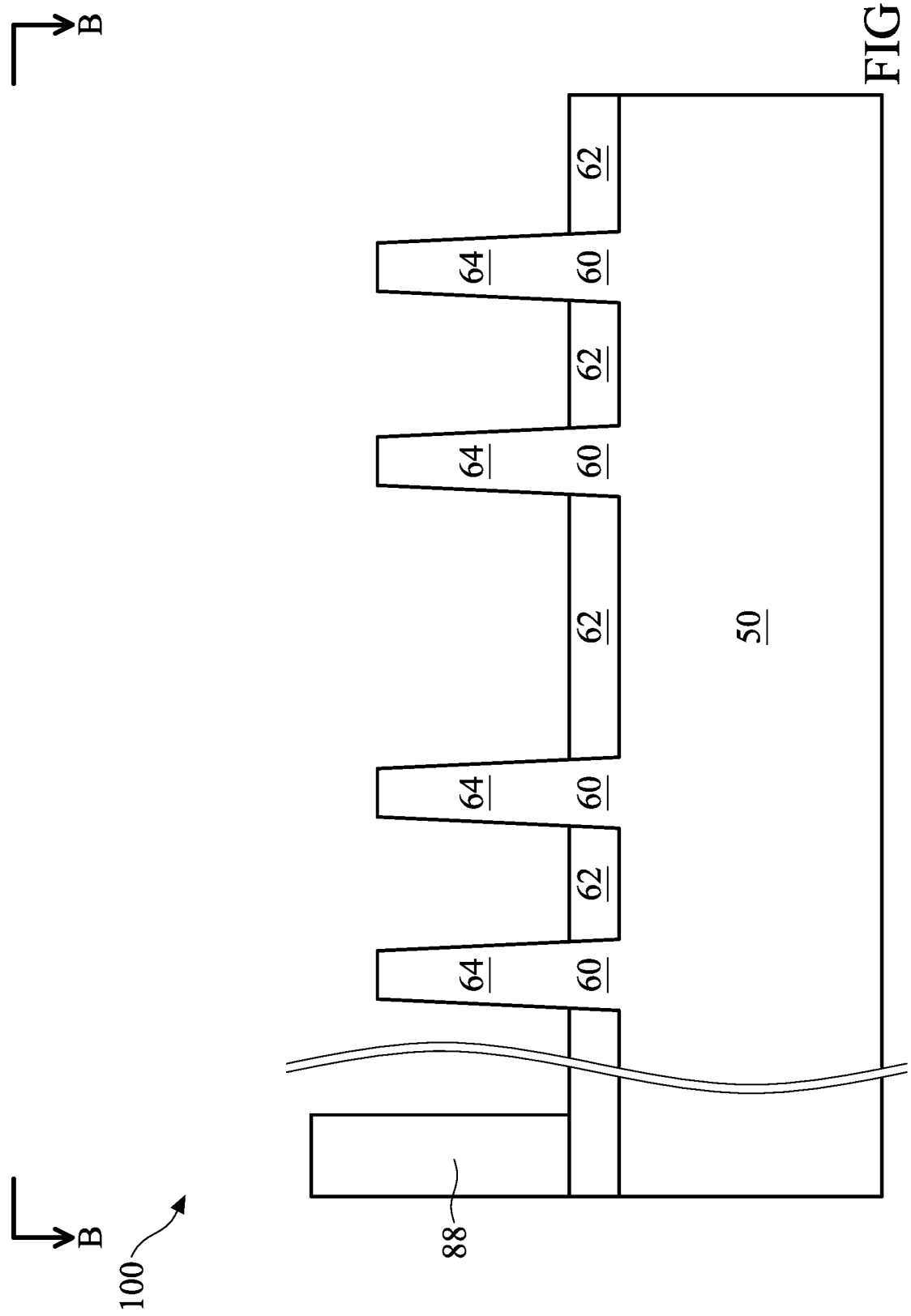
Figure 10C:
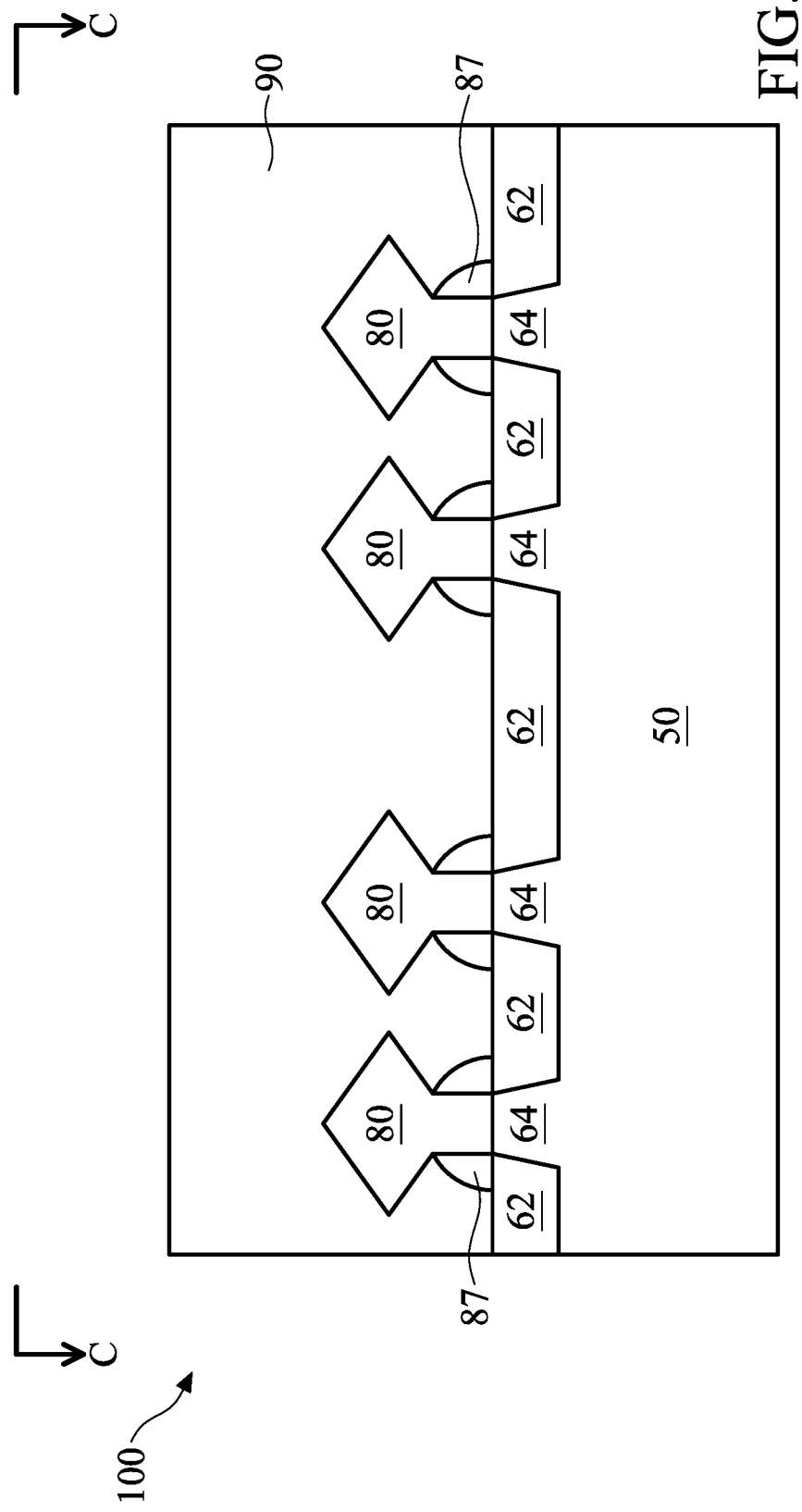

Next, in FIGS. 10A-10C, the mask 70 (if present), the dummy gate fill 68, and the dummy gate dielectric 66 are removed in one or more etching steps, so that recesses 89 are formed between respective spacers 87. Each recess 89 exposes a channel region of a respective fin 64. Each channel region may be disposed between neighboring pairs of epitaxial source/drain regions 80. In some cases, the dummy gate dielectric 66 may be used as an etch stop layer when the dummy gate fill 68 is etched. The dummy gate dielectric 66 may then be removed after the removal of the dummy gate fill 68.

Figure 11A:
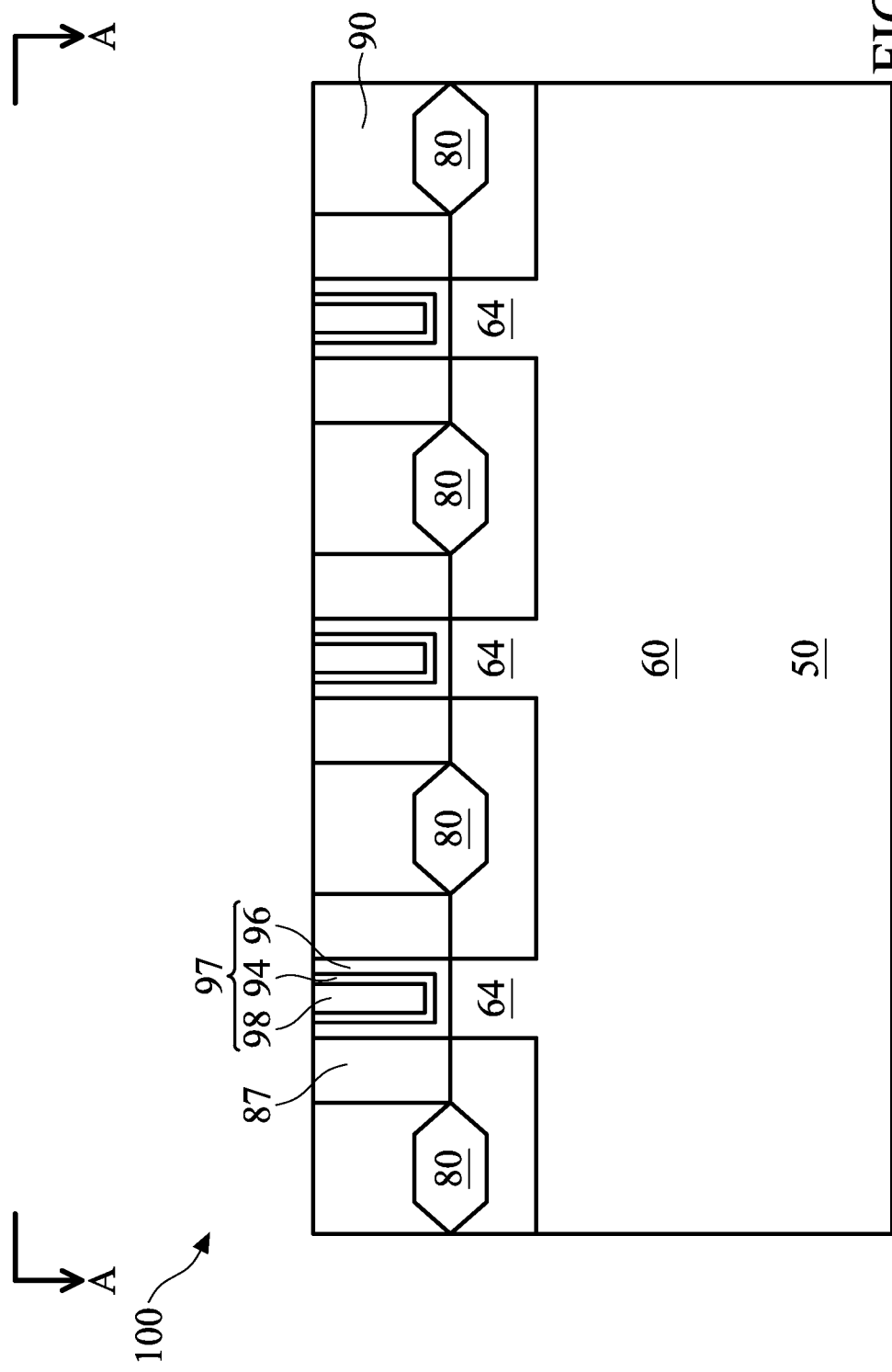
Figure 11B:
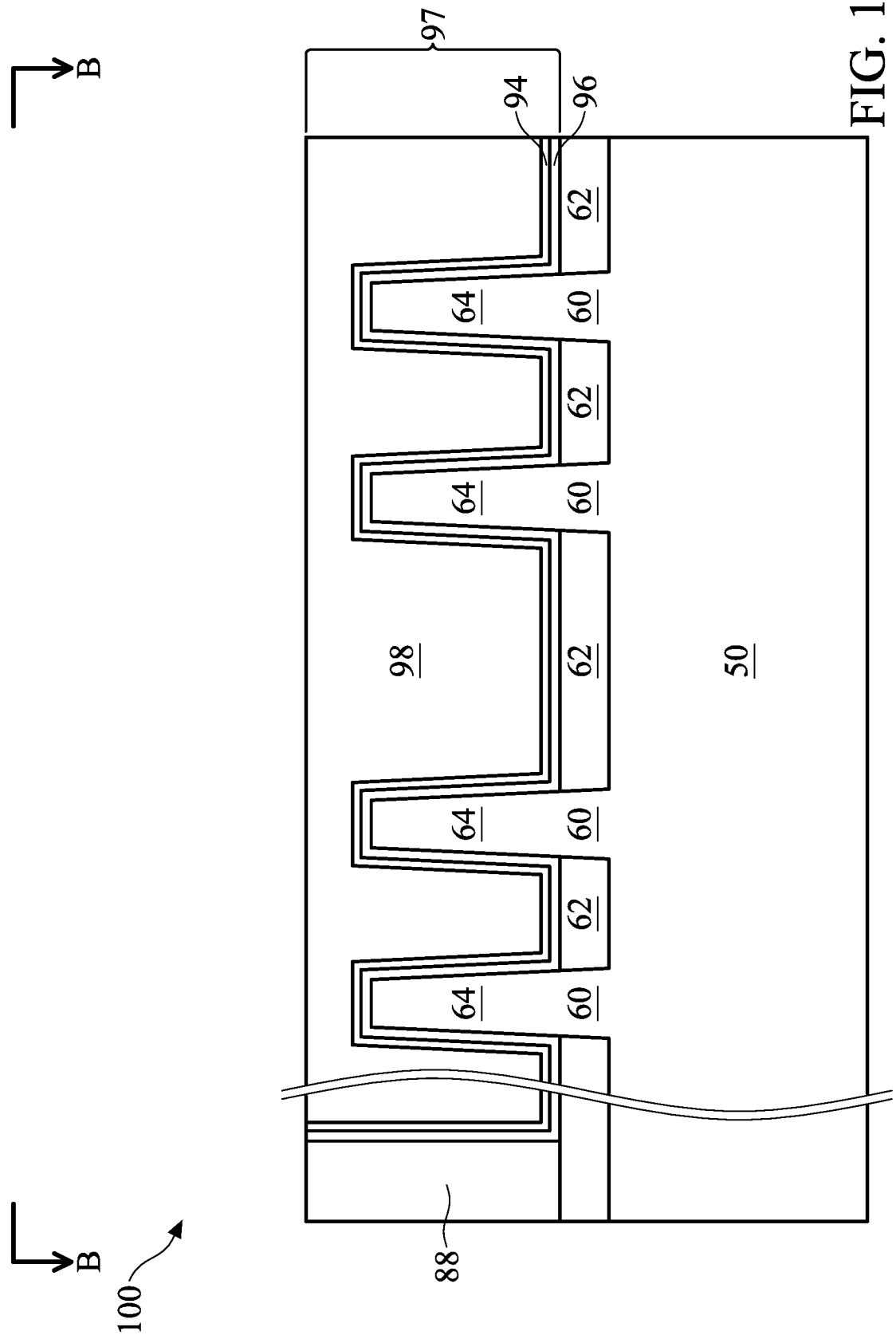
Figure 11C:
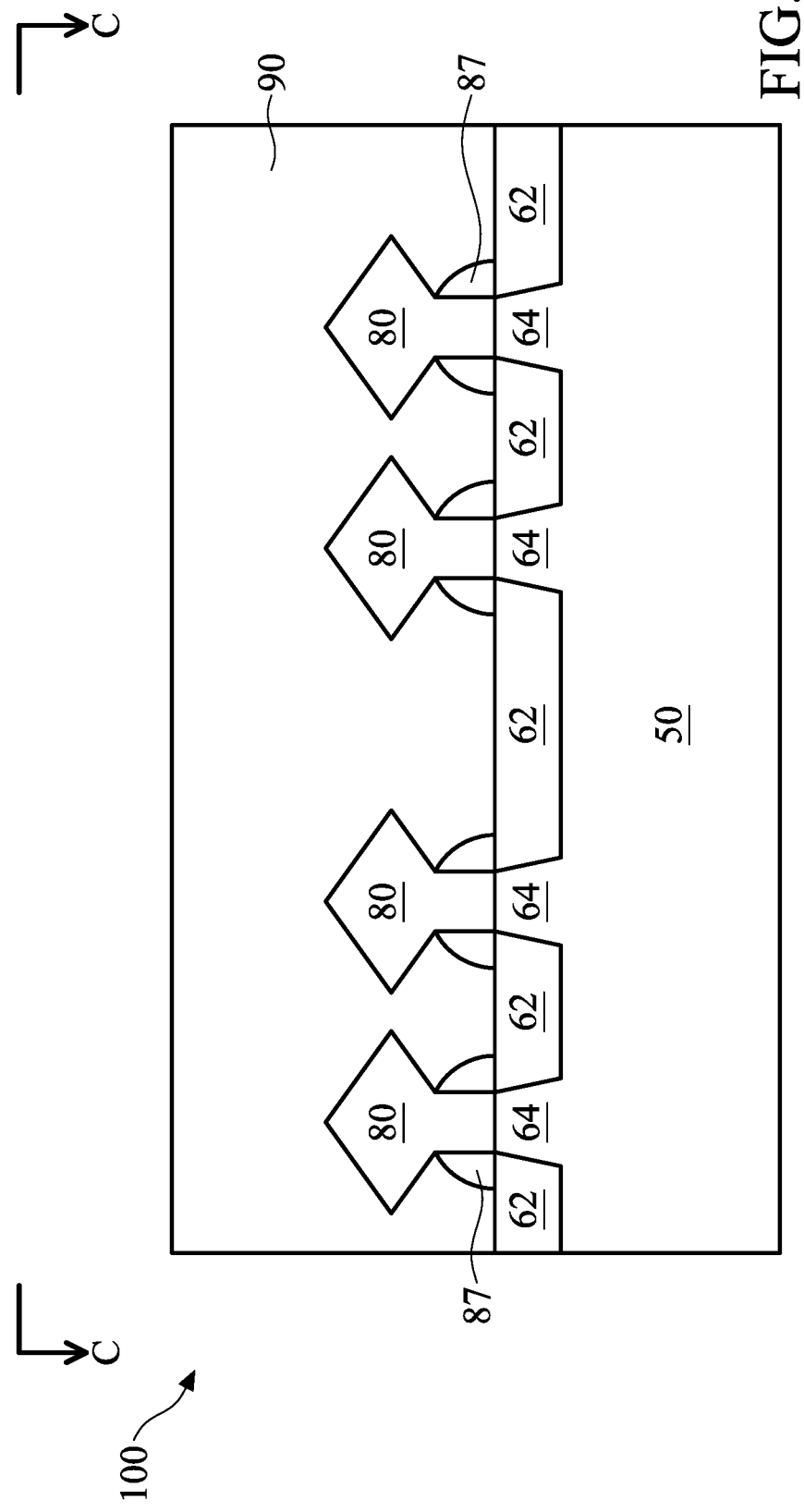

In FIGS. 11A-11C, metal gates 97 are formed in the recesses 89 by forming a gate dielectric layer 96, a work-function layer 94, and a gate fill 98 successively in each of the recesses 89. As illustrated in FIGS. 11A-11B, the gate dielectric layer 96 is deposited conformally in the recesses 89. The work-function layer 94 is formed conformally over the gate dielectric layer 96, and the gate fill 98 fills the remainder of the recesses 89. Although not shown, a barrier layer may be formed between the gate dielectric layer 96 and the work-function layer 94. As shown in FIG. 11B, the gate dielectric layer 96, work-function layer 94, and gate fill 98 may also be formed on sidewalls of end spacers 88.

In accordance with some embodiments, the gate dielectric layer 96 includes silicon oxide (SiO), silicon nitride (SiN), or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, other materials, or combinations thereof. The formation methods of gate dielectric layer 96 may include MBD, ALD, PECVD, or other processes.

Next, the barrier layer may be formed conformally over the gate dielectric layer 96. The barrier layer may include an electrically conductive material such as titanium nitride (TiN), although other materials may be used such as tantalum nitride (TaN), titanium (Ti), tantalum (Ta), the like, or combinations thereof. The barrier layer may be formed using a CVD process, such as plasma-enhanced CVD (PECVD). However, other processes, such as sputtering, metal organic chemical vapor deposition (MOCVD), atomic layer deposition (ALD), or other processes, may also be used.

The work-function layer 94 is formed conformally over the barrier layer. The work-function layer 94 may include one or more layers, and may include one or more suitable materials. The materials and layer thicknesses of the work-function layer 94 may be selected to adjust the threshold voltage (Vt) of the resulting FinFET in a predetermined manner. Exemplary p-type work-function metals that may be included in the metal gate 97 include TiN, TaN, Ru, Mo, Al, WN, $ZrSi_2$, $MoSi_2$, $TaSi_2$, $NiSi_2$, WN, other suitable p-type work-function materials, or combinations thereof. Exemplary n-type work-function metals that may be included in the metal gate 97 include Ti, Ag, TaAl, TaAlC, TiAlN, TaC, TaCN, TaSiN, Mn, Zr, other suitable n-type work-function materials, or combinations thereof. A work-function value is associated with the material composition of a work-function layer 94, and thus, the materials of the work-function layer 94 may be chosen to tune its work-function value so that a target threshold voltage (Vt) is achieved in the device that is to be formed in the respective region. The work-function layer 94 may be deposited by CVD, PVD, ALD, and/or other suitable process. N-type devices and p-type devices may have the same or a different number of work-function layers 94.

Next, the gate fill 98 is formed over the work-function layer 94. The gate fill 98 may be made of a metal-containing material such as Cu, Al, W, the like, combinations thereof, or multi-layers thereof, and may be formed by, e.g., electroplating, electroless plating, PVD, CVD, or other suitable method. A planarization process, such as a CMP, may be performed to remove the excess portions of the gate dielectric layer 96, the work-function layer 94, and the material of the gate fill 98, which excess portions are over the top surface of the first ILD 90. The resulting remaining portions of material of the gate fill 98, the work-function layer 94, and the gate dielectric layer 96 thus form metal gates 97 of the resulting FinFET device 100.

Figure 12A:
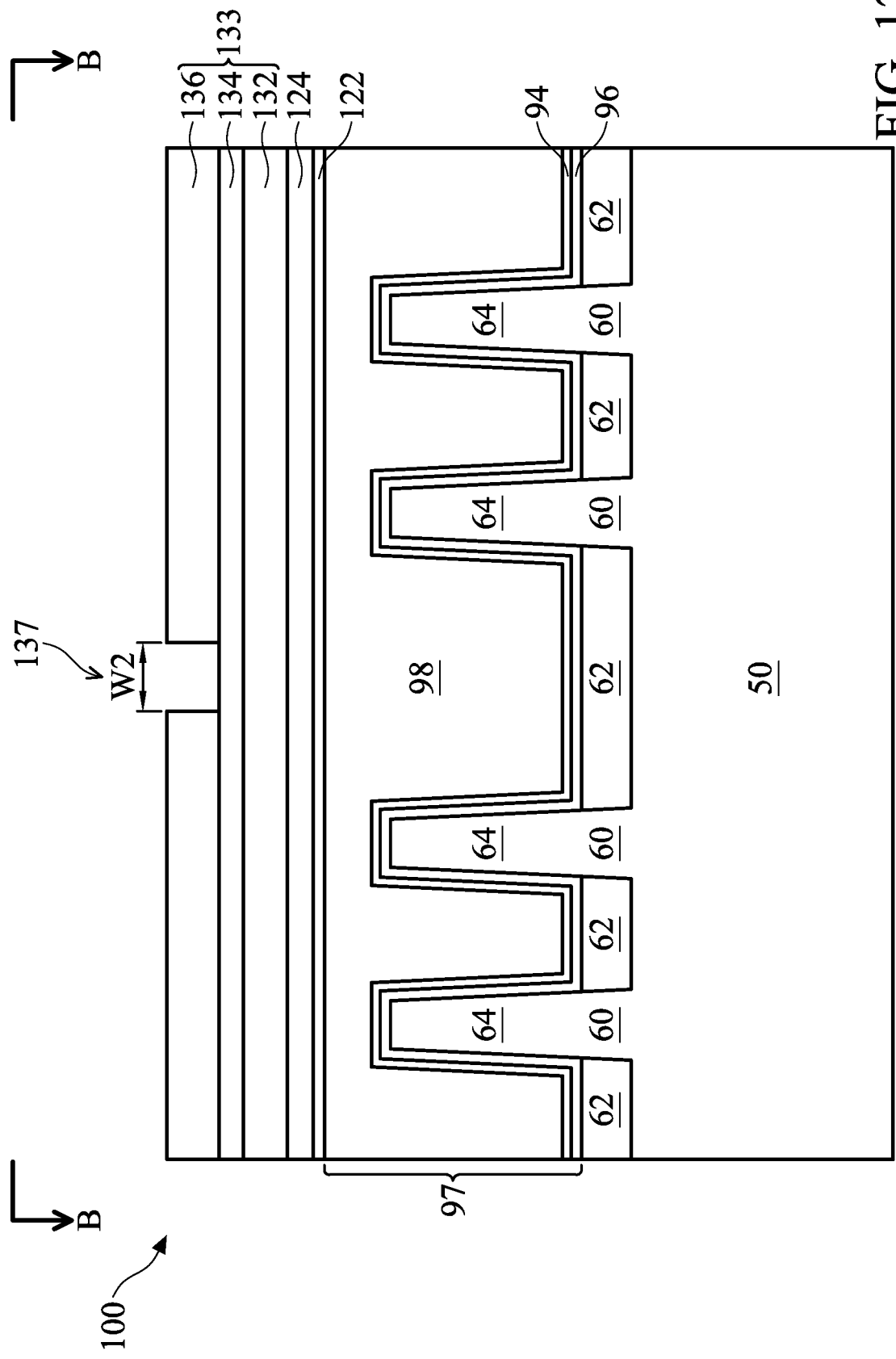
FIGS. 12A-16B illustrate various views (e.g., cross-sectional views, plan views) of the formation of a metal gate cut in a FinFET device at various stages of fabrication, in accordance with an embodiment.

Details of a metal gate cutting and fin isolation process are illustrated in FIGS. 12A-18, in accordance with an embodiment. FIG. 12A illustrates a cross-sectional view of the FinFET device 100 along cross-section B-B, FIG. 12B illustrates a cross-sectional view of the FinFET device 100 along cross-section C-C, and FIG. 12C illustrates the FinFET device 100 in a representative plan view. In FIG. 12A, a first hard mask layer 122 and a second hard mask layer 124 are formed consecutively over the FinFET device 100. Subsequently, a structure 133 is formed over the second hard mask layer 124. In some embodiments, structure 133 is a tri-layer structure that includes a top photoresist layer 136, a middle layer 134, and a bottom anti-reflective coating (BARC) layer 132, as shown in FIG. 12A.

In some embodiments, the first hard mask layer 122 is a metal hard mask layer and the second hard mask layer 124 is a dielectric hard mask layer. In subsequent processing steps, a pattern is transferred onto the first hard mask layer 122 using various photolithography and etching techniques. The first hard mask layer 122 may then be used as a patterning mask for etching the underlying structure (e.g., metal gates 97 or first ILD 90). The first hard mask layer 122 may be a masking material such as titanium nitride, titanium oxide, the like, or a combination thereof. The first hard mask layer 122 may be formed using a process such as ALD, CVD, PVD, the like, or a combination thereof. In some embodiments, the first hard mask layer 122 may have a thickness between about 1 nm and about 10 nm.

The second hard mask layer 124 is deposited over the first hard mask layer 122. The second hard mask layer 124 may be used as a masking pattern for the first hard mask layer 122. In subsequent processing steps, the second hard mask layer 124 is patterned to form patterns which may then be transferred to the first hard mask layer 122. The second hard mask layer 124 may be a masking material such as silicon nitride, silicon oxide, silicon carbide, silicon oxycarbide, silicon oxynitride, the like, or a combination thereof. The second hard mask layer 124 may be formed using a process such as CVD, ALD, the like, or a combination thereof. In an exemplary embodiment, the first hard mask layer 122 includes titanium nitride, and the second hard mask layer 124 includes silicon nitride. In some embodiments, the second hard mask layer 124 may have a thickness between about 35 nm and about 80 nm, such as about 68 nm.

The tri-layer structure 133 is formed over the second hard mask layer 124. The BARC layer 132 of the tri-layered structure 133 may include an organic or inorganic material. The middle layer 134 may include silicon nitride, silicon oxynitride, or the like. The middle layer 134 may have an etch selectivity to the top photoresist layer 136, such that the top photoresist layer 136 can be used as a mask layer to pattern the middle layer 134. The top photoresist layer 136 may include a photosensitive material. Any suitable deposition method, such as PVD, CVD, spin coating, the like, or combinations thereof, may be used to form layers of the tri-layered structure 133.

Figure 12B:
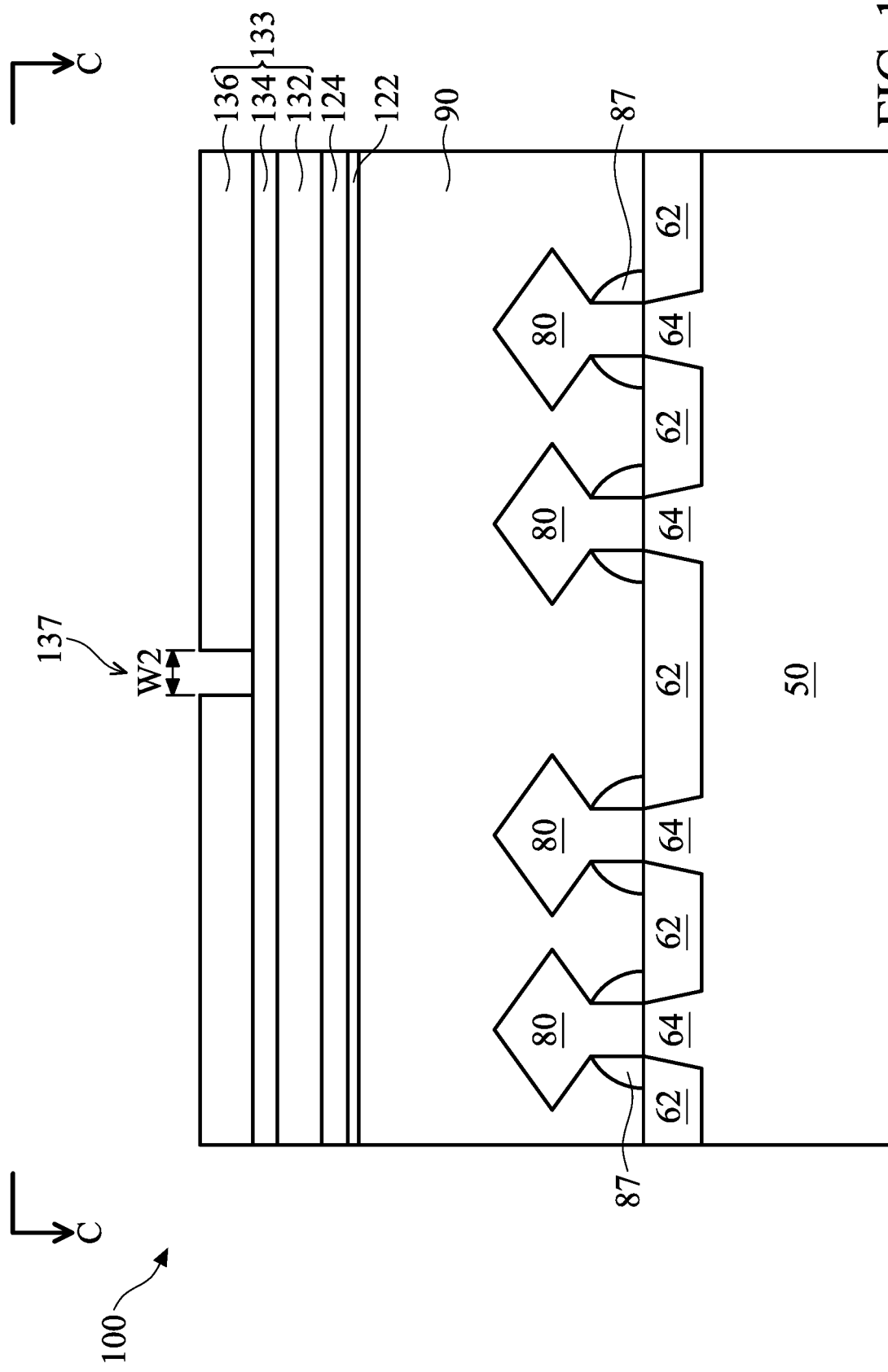
Figure 12C:
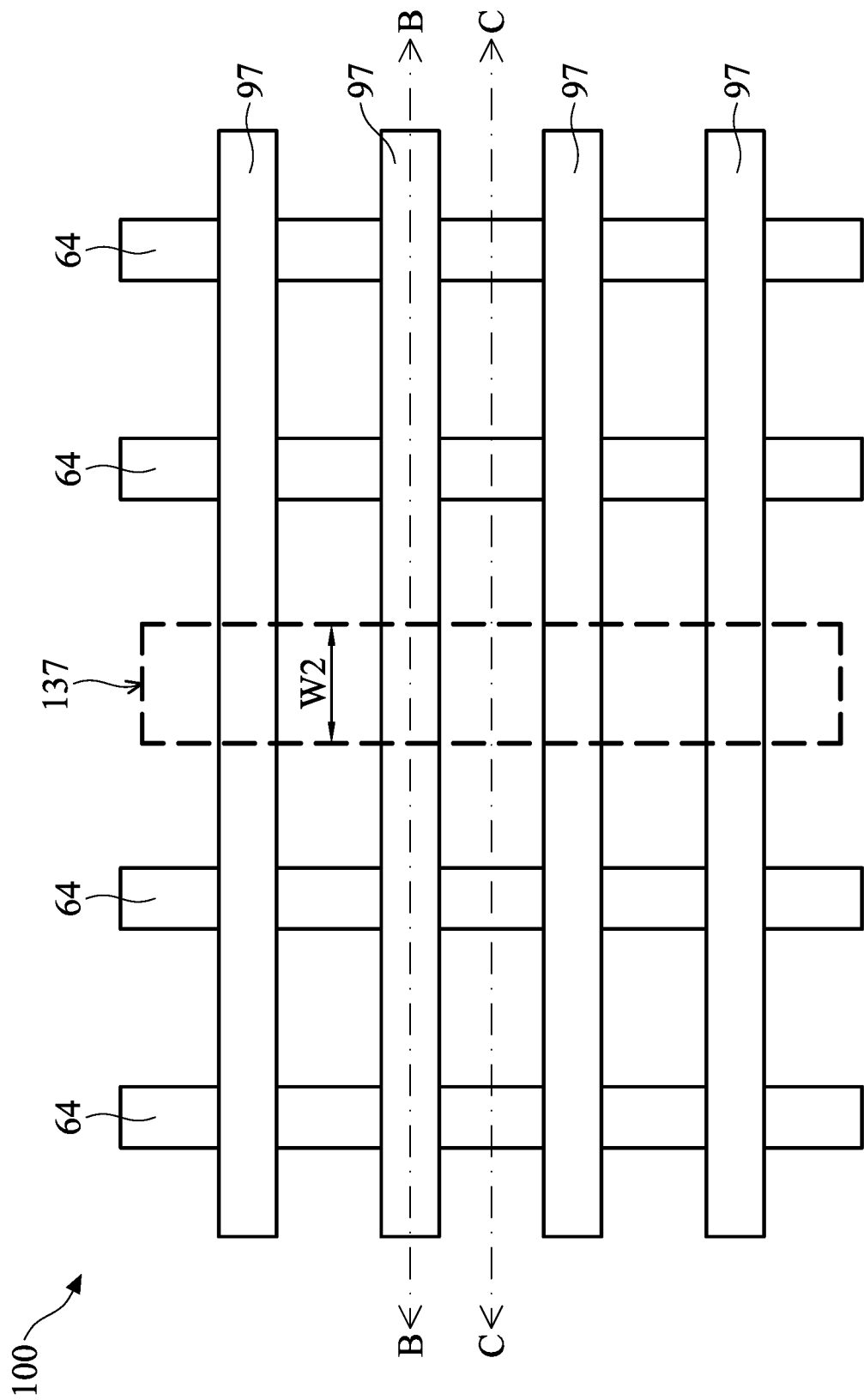

As shown in FIGS. 12A-12C, once the tri-layer structure 133 is formed, a pattern is formed in the top photoresist layer 136. A pattern is shown in FIGS. 12A-12C as example opening 137. As shown in FIGS. 12A-12C, the opening 137 may be located between adjacent fins 64 and may extend across one or more metal gates 97. The top photoresist layer 136 may be patterned using a suitable photolithographic technique. In some embodiments, the opening 137 may have a width W2 of between about 20 nm and about 35 nm, such as about 27 nm.

Figure 13A:
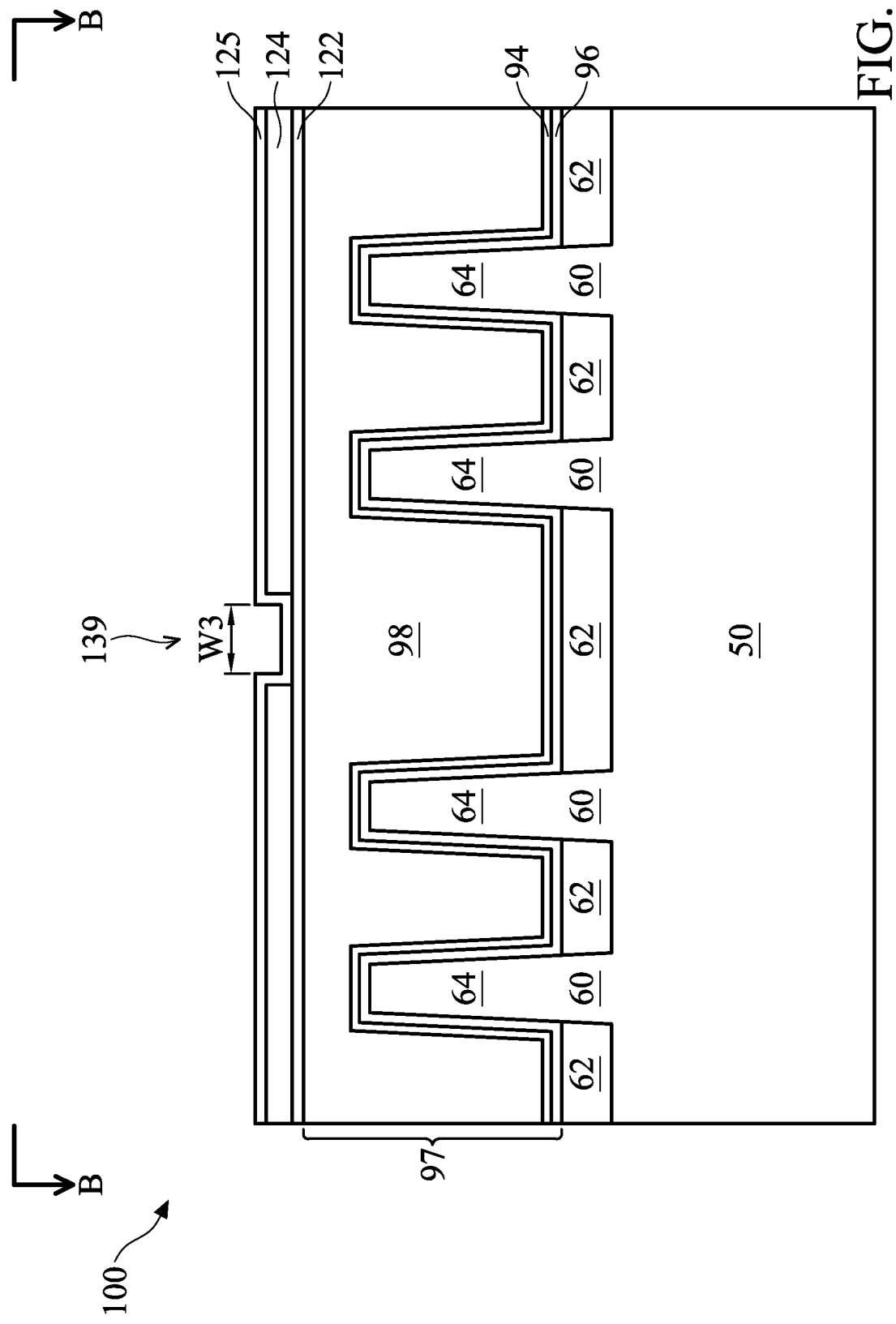
Figure 13B:
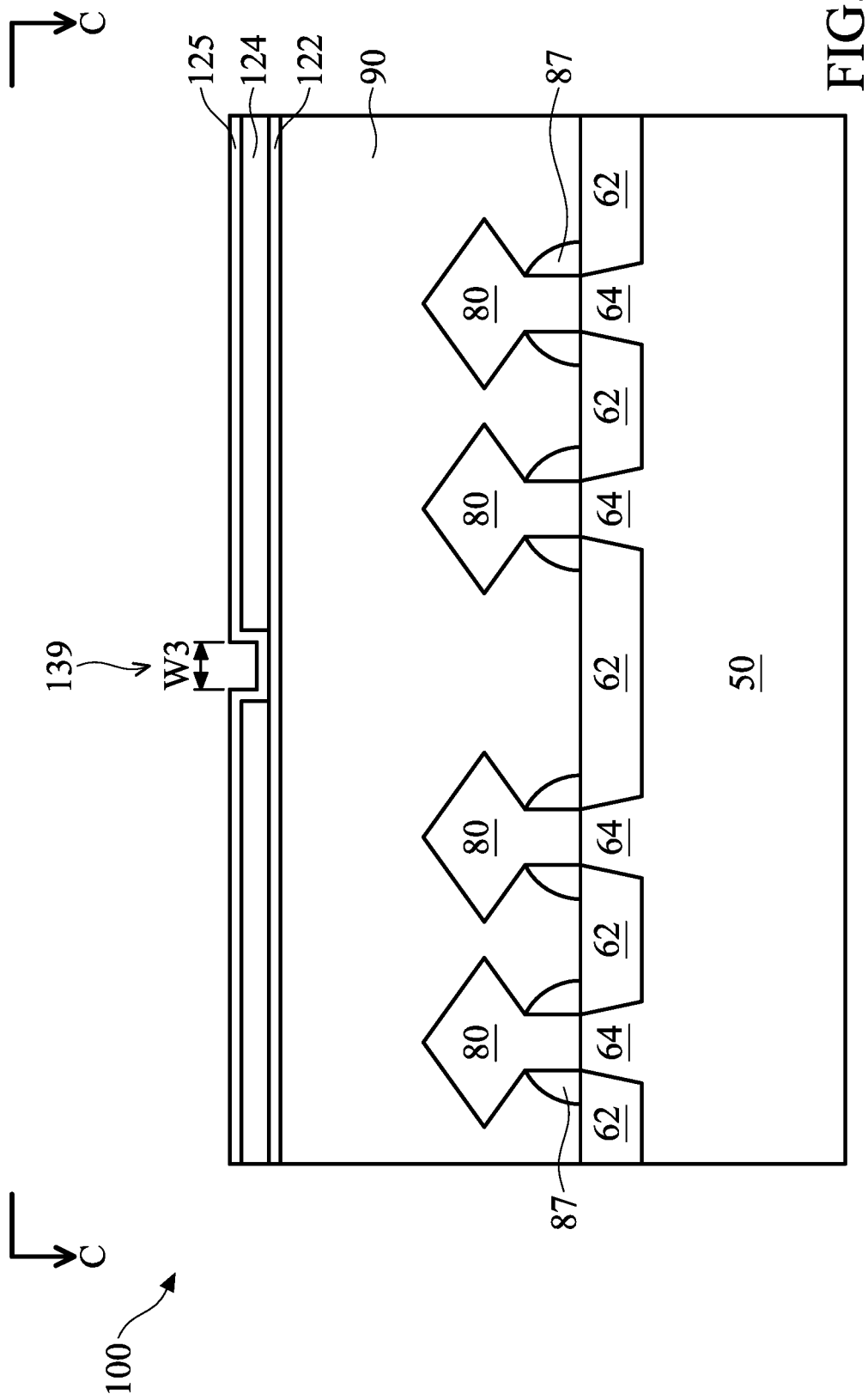

Next, as illustrated in FIG. 13A-13B, the pattern of opening 137 in the top photoresist layer 136 is extended through the middle layer 134 and the BARC layer 132, and is also transferred to the second hard mask layer 124. The pattern of opening 137 may be transferred in this manner using suitable techniques, such as the use of one or more anisotropic etching processes. As a result, an opening 139 is formed in the second hard mask layer 124. As shown in FIGS. 13A-13B, an optional conformal layer 125 may be formed over the second hard mask layer 124 and within the opening 139. The conformal layer 125 may formed on the sidewalls of the opening 139 in order to protect the sidewalls of the opening 139 and/or to decrease the width of the opening 139. The conformal layer 125 may comprise a material such as silicon nitride or the like, and may be formed using a suitable technique such as ALD or the like. In some embodiments, the conformal layer 125 may be formed having a thickness between about 1 nm and about 10 nm. In some embodiments, the opening 139 (with or without the presence of the optional conformal layer 125) may have a width W3 of between about 7 nm and about 12 nm, such as about 10 nm.

Figure 14A:
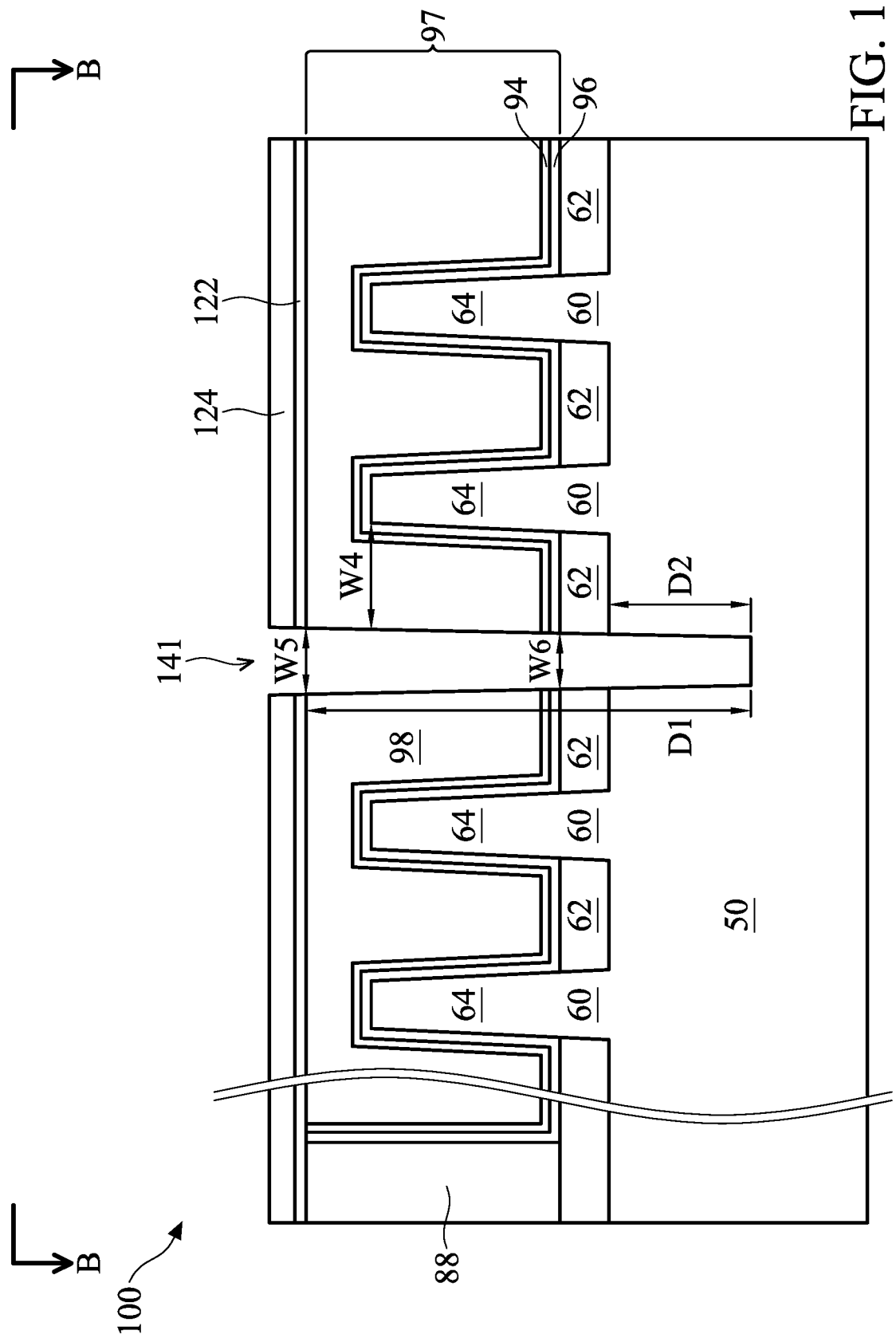
Figure 14B:
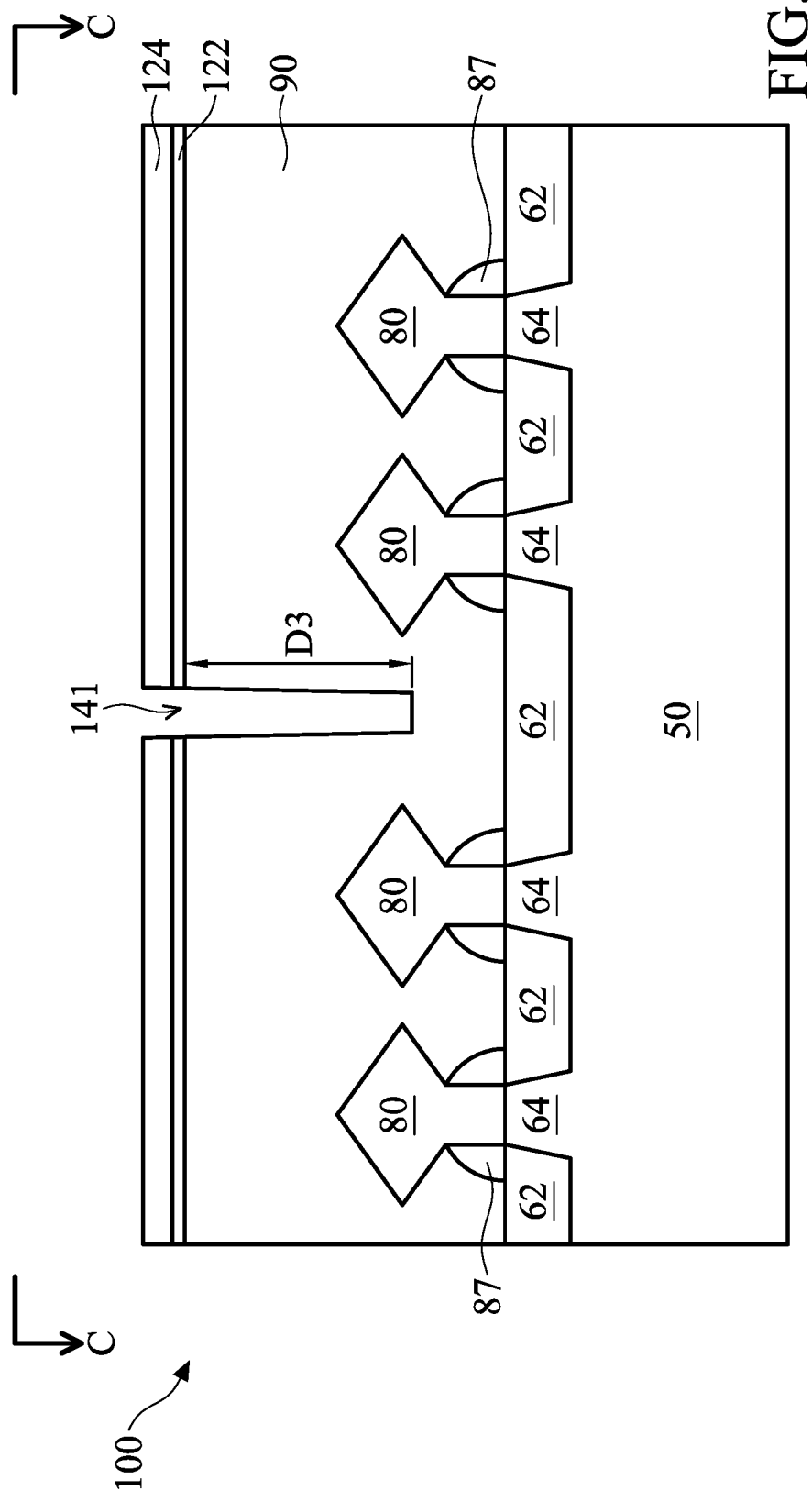
Figure 14C:
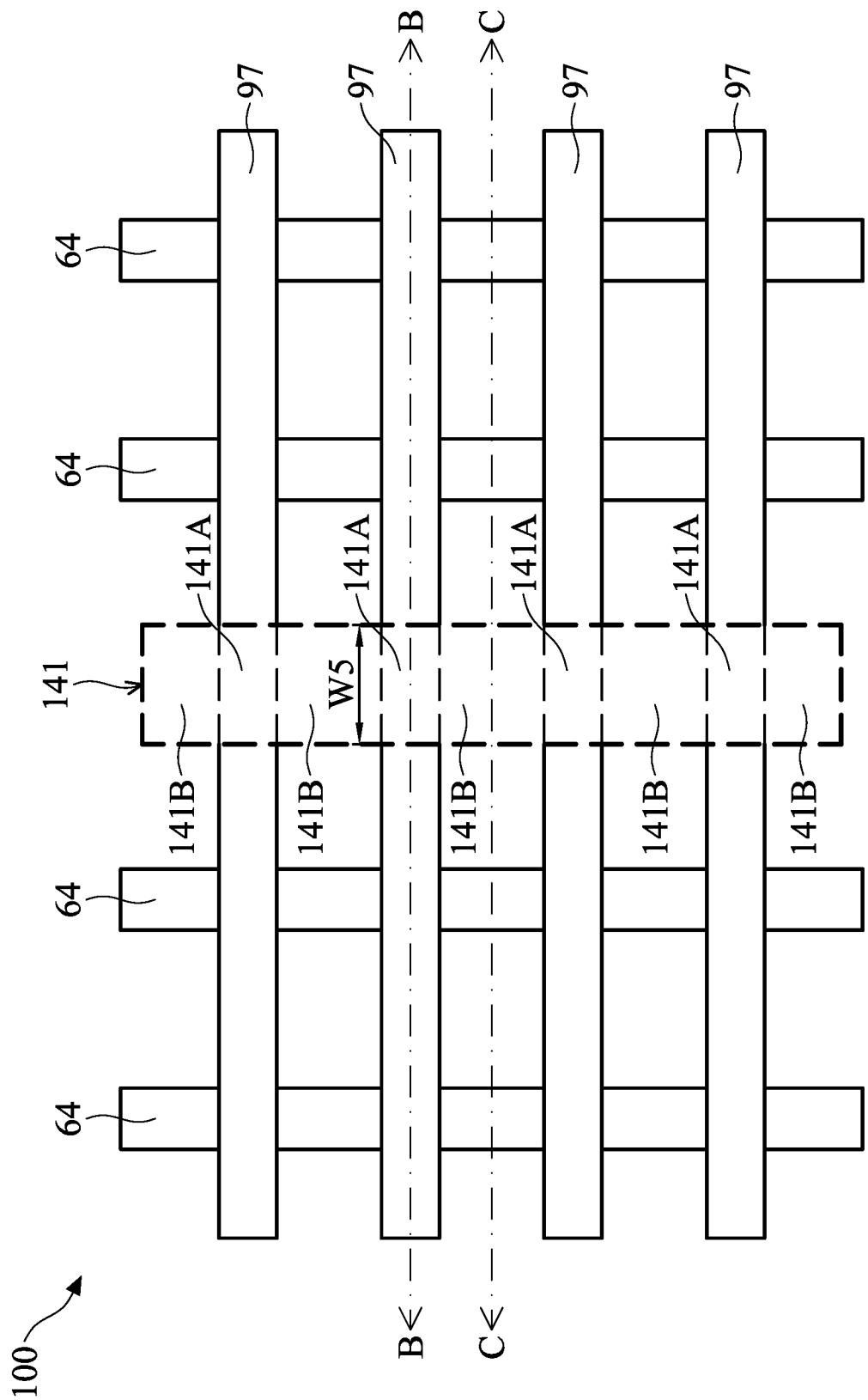

Next, as illustrated in FIGS. 14A-14C, an etching process is performed to extend the opening 139 into the metal gate 97 to form a metal gate cut region. FIG. 14A illustrates a cross-sectional view of the FinFET device 100 along cross-section B-B, FIG. 14B illustrates a cross-sectional view of the FinFET device 100 along cross-section C-C, and FIG. 14C illustrates the FinFET device 100 in a representative plan view. The opening 139 after the etching process has been designated as etched opening 141 in FIGS. 14A-14C. Portions of etched opening 141 located where metal gates 97 were previously present are designated as etched opening portions 141A, and portions of etched opening 141 located where metal gates 97 were not previously present are designated as etched opening portions 141B. Etched opening portions 141A extend into metal gates 97 as shown in FIG. 14A, and etch opening portions 141B extend into the first ILD 90 as shown in FIG. 14B. Example etched opening portions 141A and 141B are indicated in the plan view of FIG. 14C.

As shown in FIG. 14A, the etching process extends the opening 139 completely through the metal gate 97 to form etched opening 141. The etched opening 141 may extend into the isolation regions 62 underneath the metal gate 97. In some embodiments, the etched opening 141 may extend through the isolation regions 62 and into the substrate 50 underneath the metal gate 97, as shown in FIG. 14A. The portions of the metal gate 97 may be removed to form etched opening 141 using an etching process, such as an anisotropic etching process or other etching process. The etching process may also remove portions of the first hard mask layer 122, in some embodiments. Removing portions of the metal gate 97 includes removing portions of the gate dielectric layer 96, the work function layer 94, and/or the material of the gate fill 98. In some cases, the etching process may remove some of or all of the conformal layer 125, as shown in FIGS. 14A-14B.

In some embodiments, the etching process includes a plasma etching process. The plasma etching process may be, for example, an Atomic Layer Etching (ALE) process, an RIE process, or another process. In some embodiments, the plasma etching process is performed in a processing chamber with process gases being supplied into the processing chamber. Process gases may include $CF_4$, $C_2F_6$, $CH_3F$, $CHF_3$, $Cl_2$, $C_4H_6$, $BCl_3$, $SiCl_4$, HBr, $O_2$, other gases, or a combination of gases. In some embodiments, the plasma etching process includes multiple etching cycles in which a protective film (not shown) is deposited on the sidewalls of the opening 139 during each cycle. For example, the protective film may be a material such as a fluorocarbon polymer ($C_xF_y$) or a silicon oxide that covers sidewall surfaces and inhibits etching of the covered sidewall surfaces. By alternately etching to deepen the opening 139 and then depositing protective film over sidewalls of the opening 139, the profile of the etched opening 139 may have straighter sidewalls. The relative amount of protective film that is deposited during each part of an etch cycle may be controlled by controlling the ratio of the different process gases used in each part of the etch cycle. In some cases, process gases $SiCl_4$ and HBr at a $SiCl_4$:HBr ratio between about 1:1 and about 1:2 are used during a first part of each etch cycle, and at a ratio between about 0.2:1 and about 2:1 during a second part of each etch cycle. The process gases may be flowed into the processing chamber at a rate between about 5 sccm and about 950 sccm. Carrier gases, such as nitrogen, argon, helium, xenon, or the like, may be used to carry process gases into the processing chamber. The plasma etching process may be performed using a bias voltage between about 0 volts and about 500 volts, and having a power between about 100 watts and about 3000 watts. The plasma etching process may be performed at a temperature between about 50° C. and about 200° C. A pressure in the processing chamber may be between about 3 mTorr and about 5 Torr. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as using a transformer coupled plasma generator, inductively coupled plasma systems, magnetically enhanced reactive ion techniques, electron cyclotron resonance techniques, or the like.

In some embodiments, after the etching process, remaining residue from a protective film or other byproducts from the etching process may be removed using a cleaning process, which may include a wet cleaning process, a plasma process, or a combination. In some embodiments, the plasma process may include an oxygen plasma (e.g., an ashing process) or exposure to another type of plasma. In an embodiment, the wet cleaning process may include a wet etch, such as an anisotropic wet etch. The wet cleaning process may include the use of etchants such as HF, $NH_4OH$, HCl, $H_2O_2$, $H_2SO_4$, combinations thereof, or the like. The wet cleaning process may be performed at a temperature between about 0° C. and about 100° C., such as about 70° C. In some embodiments, the cleaning process includes evacuating residue material from the processing chamber using, e.g., a pump connected to the processing chamber. In some embodiments, a thorough cleaning process may reduce the chance of remaining conductive residue (e.g. from etched portions of the metal gate 97) making undesirable electrical connections between regions of the metal gate 97 across the etched opening 141.

Referring to FIG. 14A, in some embodiments, a total depth D1 of the etched opening 141 as measured from the top of the metal gate 97 to the bottom of the opening 141 may be between about 150 nm and about 250 nm. In some embodiments, the etched opening 141 may extend into the substrate 50 a distance D2 of between about 1 nm and about 50 nm. A sidewall of the etched opening 141 may be located from one or more adjacent fins 64 a distance W4 that is between about 5 nm and about 25 nm. The etched opening 141 may have an approximately tapered shape, in which the etched opening 141 is widest near the top of the metal gate 97. In some cases, widths of the etched opening 141 farther from the top of the metal gate 97 may be smaller than widths of the etched opening 141 closer to the top of the metal gate 97. In some embodiments, a width W5 of the etched opening 141 near the top of the metal gate 97 may be between about 15 nm and about 28 nm. In some cases, having a width W5 that is greater than about 22 nm can allow the etched opening 141 to be formed having a greater total depth D1, such as a total depth D1 that is greater than about 200 nm. In some embodiments, a width of the etched opening 141 nearer the top of the metal gate 97 (e.g., width W5) may be greater than a width of the etched opening 141 farther from the top of the metal gate 97 (e.g., width W6). In some embodiments, a width W6 of the etched opening 141 near the top of the isolation regions 62 may be between about 9 nm and about 25 nm. In some cases, width W6 may be about the same as width W5. In some embodiments, the etched opening 141 has a length:width aspect ratio between about 7:1 and about 18:1. Referring to FIG. 14B, in some embodiments, the etched opening 141 extends a distance D3 into the first ILD 90 that is between about 100 nm and about 250 nm. In some embodiments, the etching process does not etch as deeply into etched opening portions 141B as into etched opening portions 141A. For example, the depth D1 of etched opening portions 141A may be greater than the depth D3 of etched opening portions 141B. In some cases, the etching process may be more selective to the material in the etched opening portions 141B, such as the material of the first ILD 90 or other materials, than to the material in the etched opening portions 141A, such as the gate fill 98 or other materials. In this manner, the etched opening 141 may have different depths at different locations. In some embodiments, etched opening portions 141B extend completely through the first ILD 90 and may extend into first isolation regions 62.

Figure 15A:
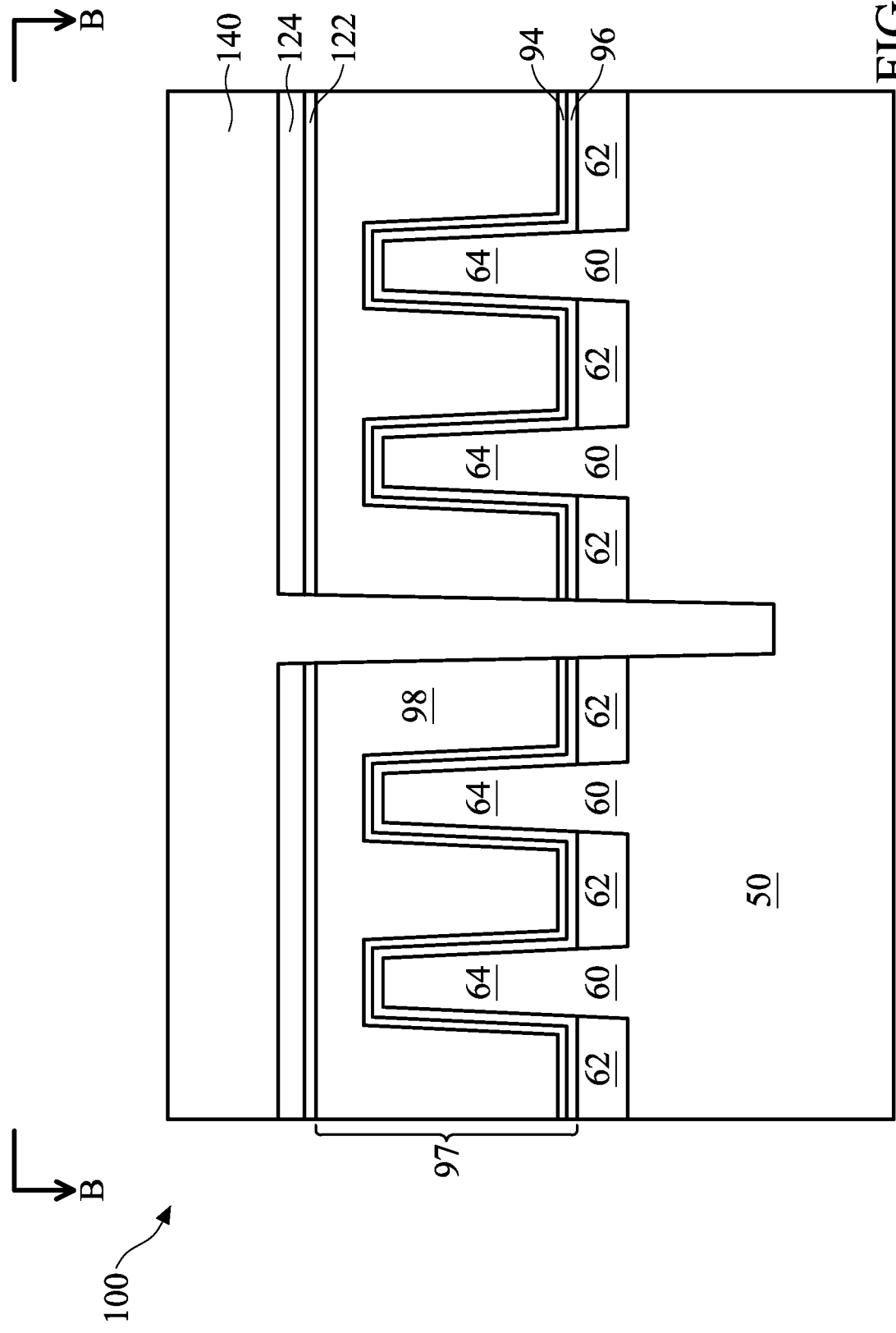
Figure 15B:
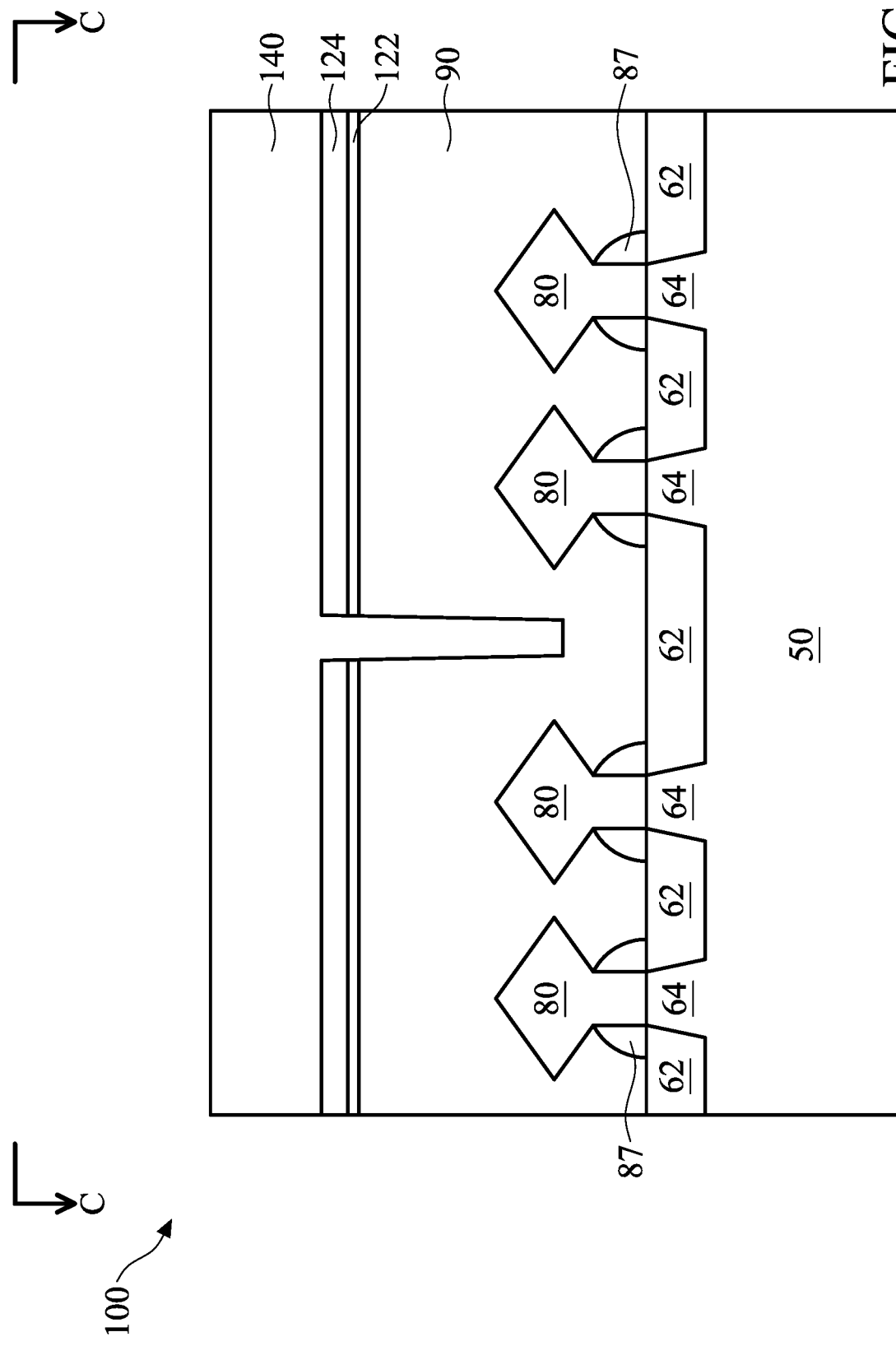

Turning now to FIGS. 15A-15B, the etched opening 141 is filled by dielectric material 140 to form a gate isolation region (i.e., a metal gate cut) within metal gate 97. The dielectric material 140 may include silicon nitride, silicon oxide, silicon oxynitride, silicon carbide, other insulating materials, and the like. In some embodiments, the dielectric material may include multiple materials or multiple layers. In some embodiments, the dielectric material may be formed by PVD, PECVD, CVD, ALD, or another suitable deposition method.

Figure 16A:
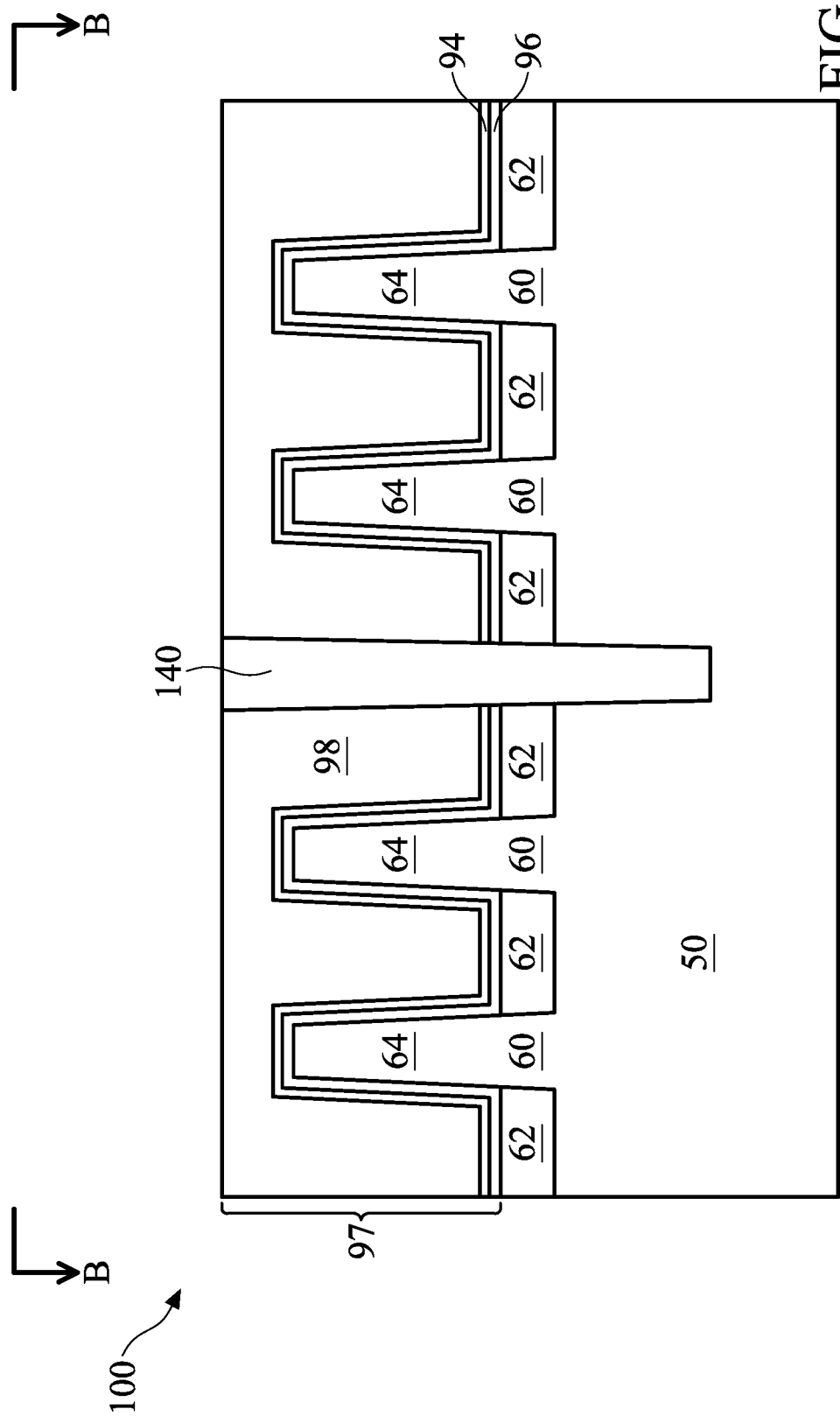
Figure 16B:
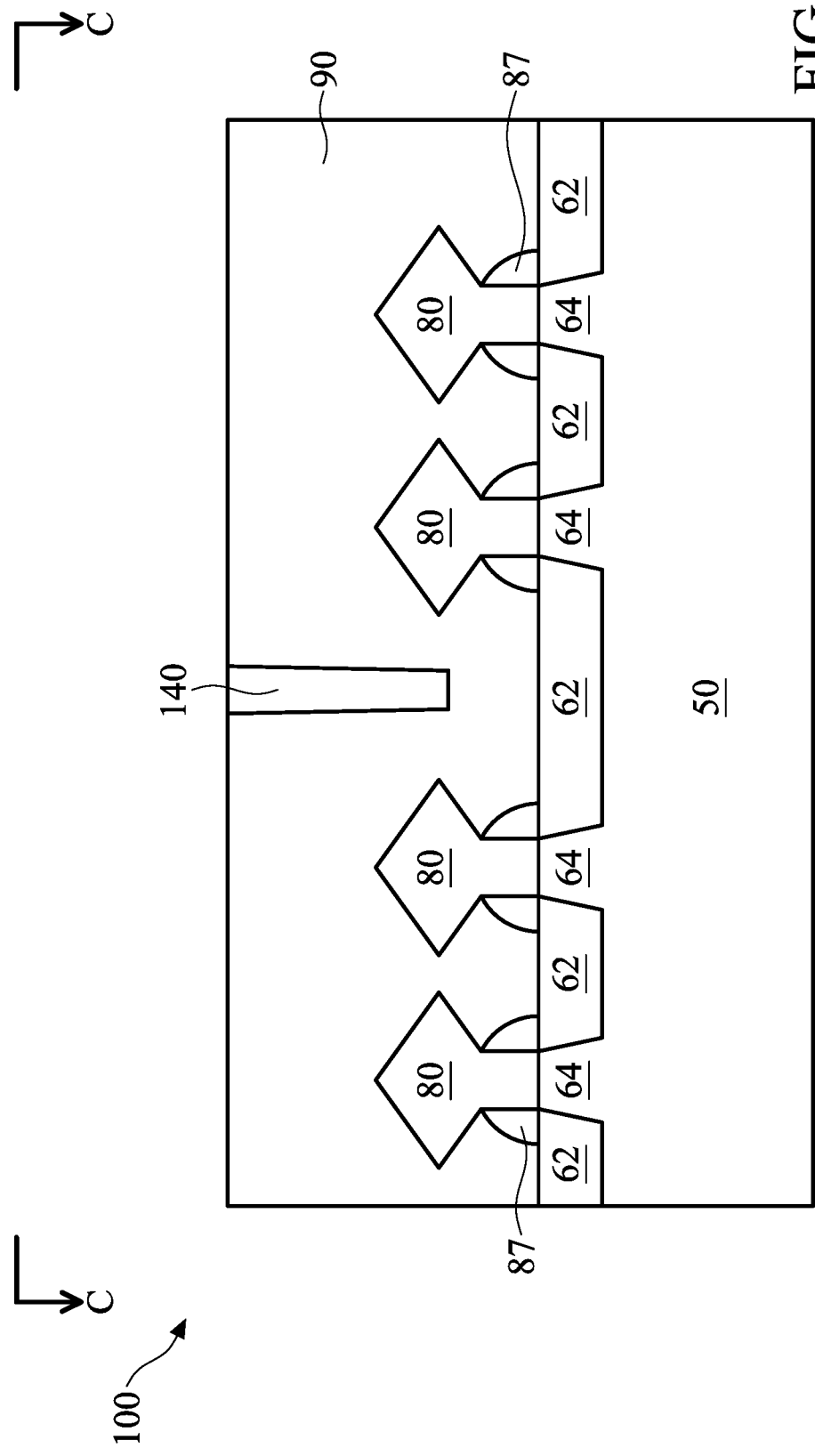
Figure 17A:
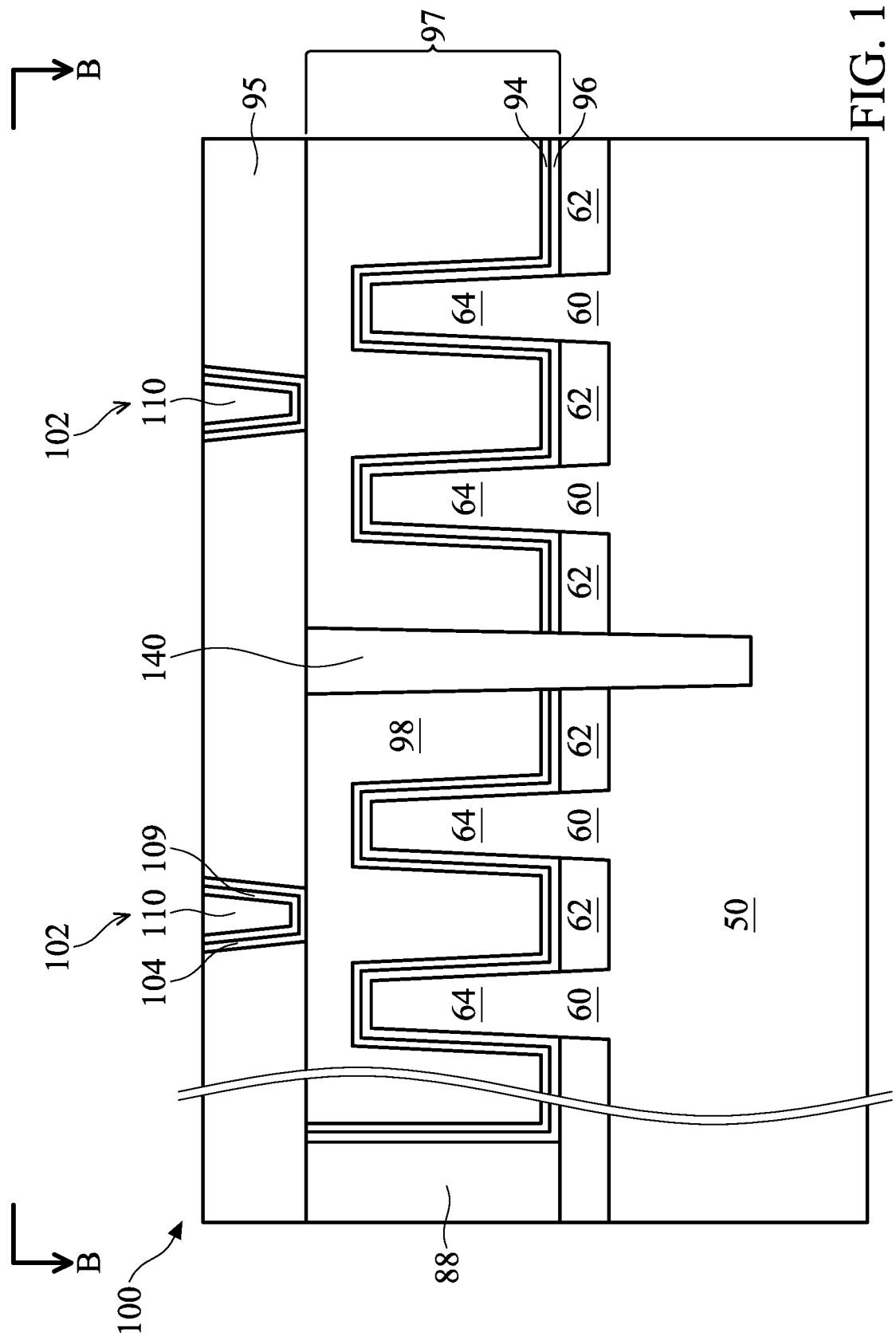
FIGS. 17A-17B illustrates cross-sectional views of a FinFET device during fabrication, in accordance with an embodiment.
Figure 17B:
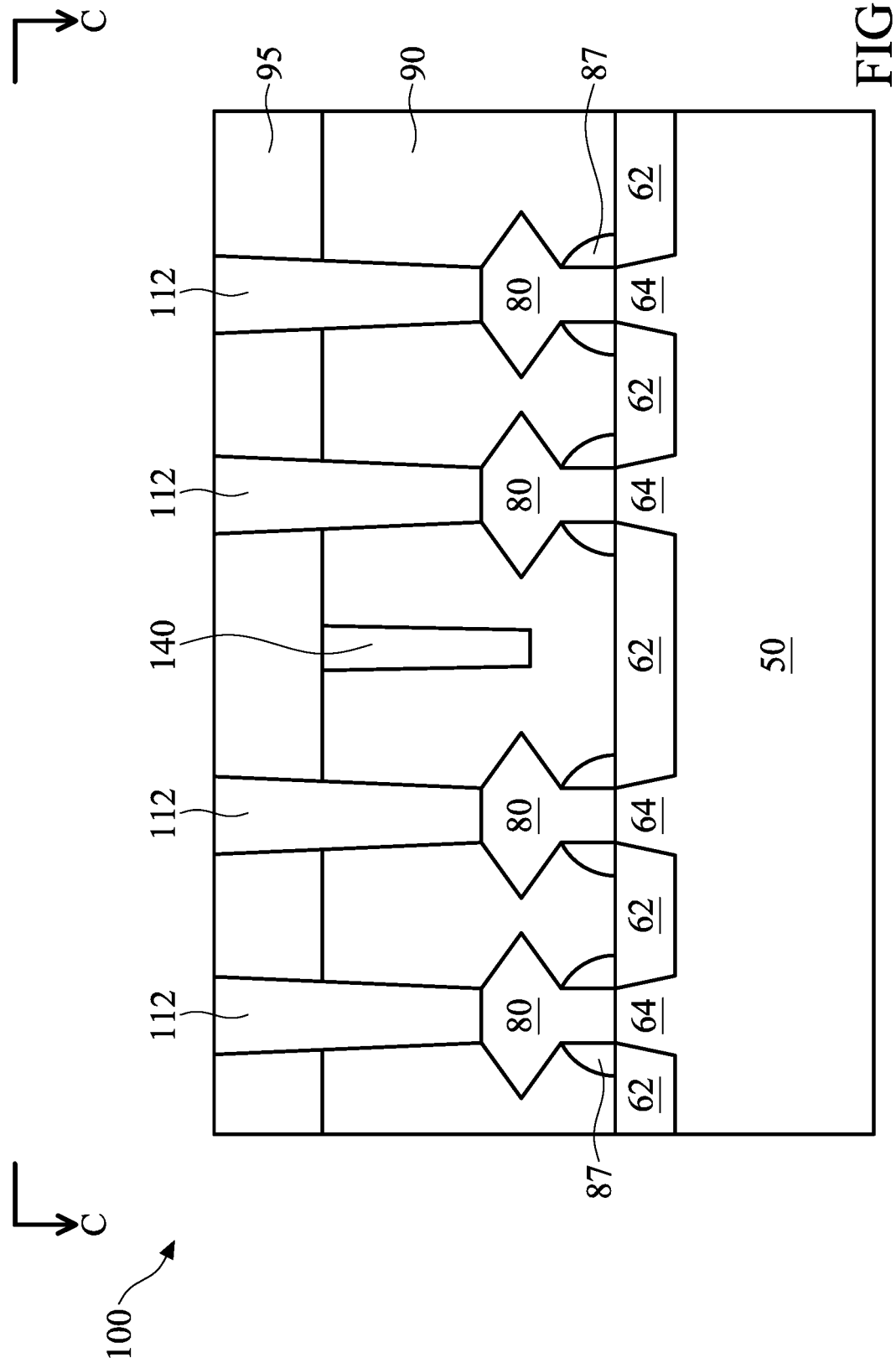

As illustrated in FIGS. 16A-16B, a planarization process, such as a CMP process, is performed to remove the first hard mask layer 122, the second hard mask layer 124, and excess portions of the dielectric layer 140. The planarization process may also remove portions of the gate fill 98 or the first ILD 90. Next, as illustrated in FIGS. 17A-17B, contacts 102 are formed over and electrically connected to the metal gates 97, and contacts 112 are formed over and electrically connected to the epitaxial source/drain regions 80. To form the contacts 102 and the contacts 112, a second ILD 95 is formed over the first ILD 90. In some embodiments, the second ILD 95 is formed of a dielectric material such as PSG, BSG, BPSG, USG, or the like, and may be deposited by any suitable method, such as CVD and PECVD. In some embodiments, the second ILD 95 is a flowable film formed by a flowable CVD method, but other techniques may be used. Contact openings are formed through the first ILD 90 and/or the second ILD 95 to expose the source/drain regions 80 and the metal gates 97. The contact openings may be formed using any suitable photolithographic or etching techniques. The contact openings are then filled with electrically conductive material(s) to form the contacts 102 and the contacts 112. In some embodiments, silicide regions (not shown) are formed over the source/drain regions 80 before the contact openings are filled, forming contacts 112.

In some embodiments, formation of the contacts 102 includes a barrier layer 104 formed within the contact openings. The barrier layer 104 may include titanium nitride, tantalum nitride, titanium, tantalum, the like, and may be formed by ALD, PVD, CVD, or other suitable deposition method. Next, a seed layer 109 is formed over the barrier layer 104. The seed layer 109 may be deposited by PVD, ALD or CVD, and may be formed of tungsten, copper, or copper alloys, although other suitable methods and materials may alternatively be used. Once the seed layer 109 has been formed, a conductive material 110 may be formed onto the seed layer 109, filling and overfilling the contact openings. The conductive material 110 may include tungsten, although other suitable materials such as aluminum, copper, tungsten nitride, ruthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Once the contact openings have been filled, excess barrier layer 104, seed layer 109, and conductive material 110 outside of the contact openings may be removed through a planarization process such as CMP, although any suitable removal process may be used. Contacts 102 are thus formed in the contact openings. The number and the location of the contacts 102 or contacts 112 may be different without departing from the spirit of the present disclosure, and these and other modifications are fully intended to be included within the scope of the present disclosure. In some embodiments, the contacts 112 are formed using a similar technique as contacts 102, and may include a barrier layer or a seed layer (not shown). The contacts 102 and the contacts 112 may be formed in the same steps or in different steps. For example, the contacts 102 may be formed before or after formation of the contacts 112.

Figure 18:
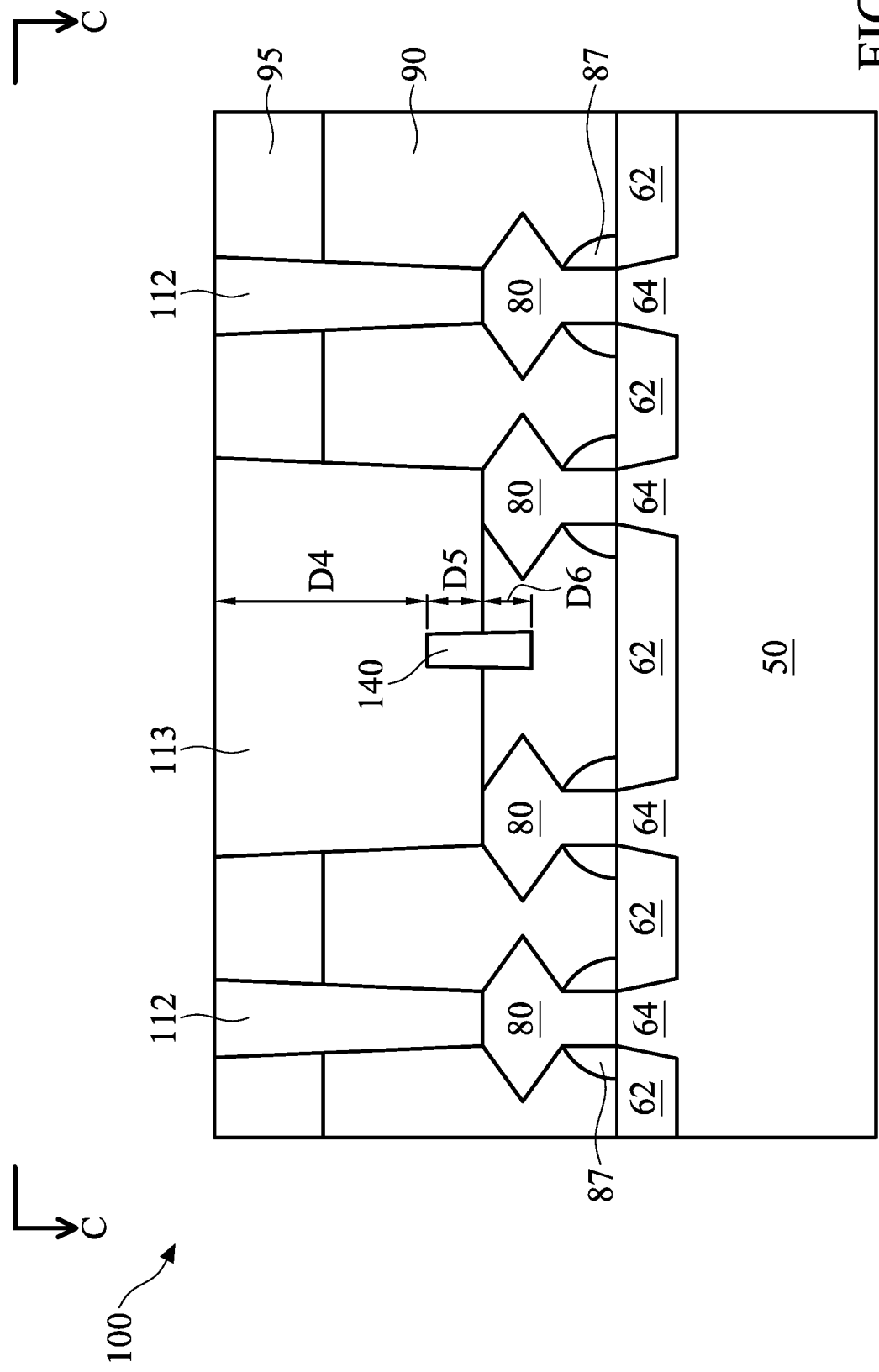
FIG. 18 illustrates a cross-sectional view of the formation of a contact of a FinFET device during fabrication, in accordance with an embodiment.

FIG. 18 shows an example embodiment in which a contact 113 is shared between two adjacent epitaxial source/drain regions 80 in a cross-sectional view of the FinFET device 100 along cross-section C-C. The contact 113 extends over a portion of the dielectric material 140 located between the epitaxial source/drain regions 80. A contact opening is formed into the second ILD 95 and the first ILD 90 using an etching process, exposing epitaxial source/drain regions 80. Portions of the dielectric material 140 are also etched. The contact opening is then filled with electrically conductive material(s) to form the contact 113. In some cases, all of the dielectric material 140 is removed by the etching process. In other cases, when the contact opening is etched, not all of the dielectric material 140 is removed by the etching process, as shown in FIG. 18. In some cases, the dielectric material 140 may extend deeper into the first ILD 90 than the contact opening, leaving a portion of dielectric material 140 remaining below the contact opening after the etching process. In some cases, the etching process that forms the contact opening may be selective to the material of the first ILD 90 over the dielectric material 140, and some portion of the dielectric material 140 remains unetched within the contact opening. For example, a plasma etching process using $C_4F_6$, $CH_3F$, $C_4F_8$, $SF_6$, or other gases as process gases can selectively etch a first ILD 90 of $SiO_2$ over a dielectric material of SiN. In some embodiments, the top of the remaining portion of the dielectric material 140 is a distance D4 from the top of the contact 113 that is between about 30 nm and about 80 nm. In some embodiments, the remaining portion of the dielectric material 140 extends above the bottom of the contact 113 a distance D5 between about 0 nm and about 20 nm. In some embodiments, the remaining portion of the dielectric material 140 extends below the bottom of the contact 113 a distance D6 between about 0 nm and about 70 nm. In some cases, leaving a portion of the dielectric material 140 remaining may reduce the chance of undesirable electrical shorts between contact 113 and metal gate 97.

Figure 19:
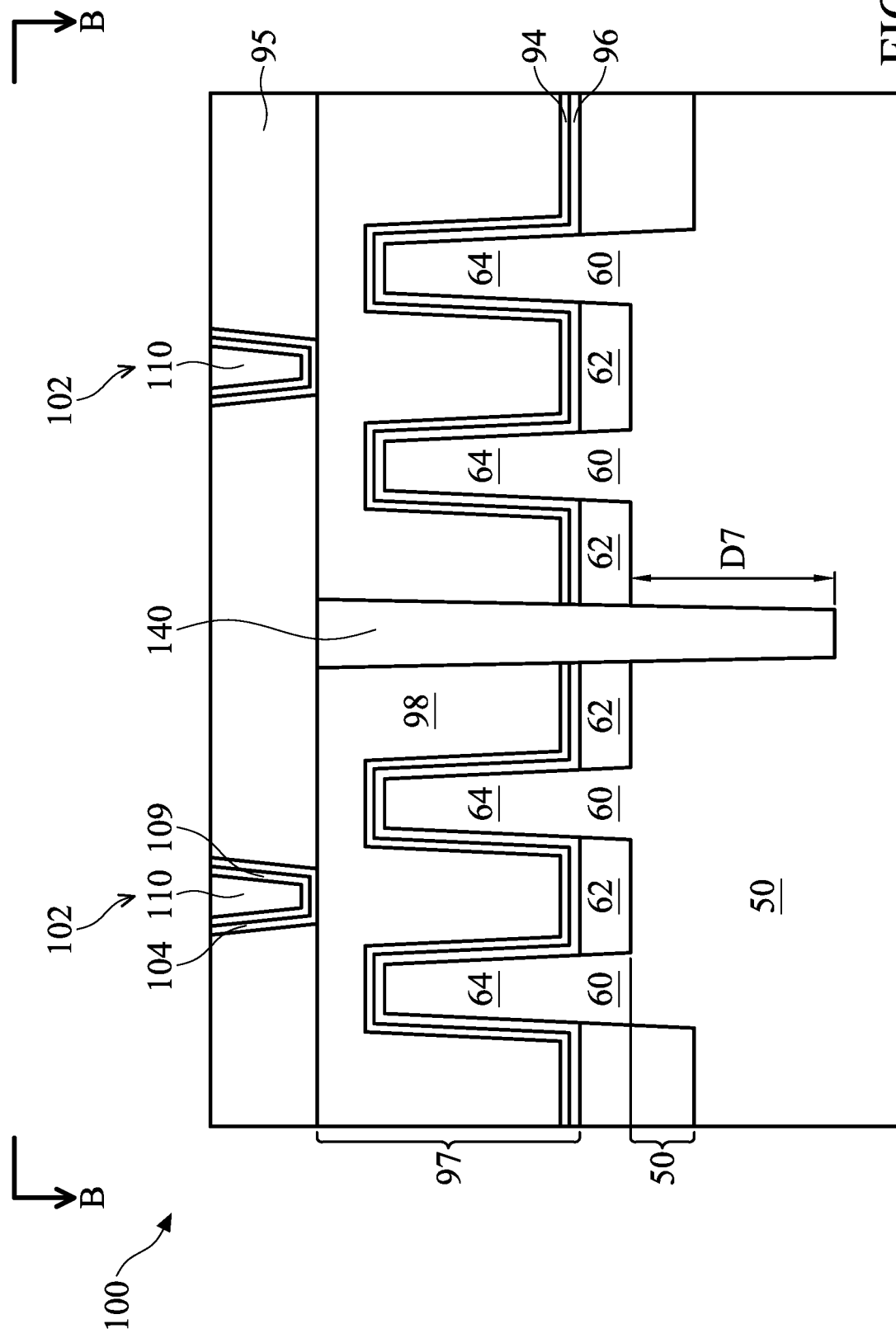
FIG. 19 illustrates a cross-sectional view of the formation of a metal gate cut of a FinFET device having a crown structure during fabrication, in accordance with an embodiment.

FIG. 19 shows an example embodiment in which the FinFET device 100 includes a crown structure 51 in a cross-sectional view of the FinFET device 100 along cross-section B-B. The crown structure 51 may be similar to that shown in FIG. 3B previously. In some embodiments, the dielectric material 140 is formed over and extending into the crown structure 51 between adjacent fins 64. In some embodiments, the dielectric material 140 may be formed extending below the crown structure 51, as shown in FIG. 19. In some embodiments, the dielectric material 140 may extend a distance D7 below a top surface of the crown structure 51 that is between about 0 nm and about 50 nm. In some embodiments, a thickness of an isolation region 62 over a portion of the recessed substrate 50 may be greater than or about the same as a thickness of an isolation region 62 over a portion of the crown structure 51 having thickness T2 (see FIG. 3B), and/or a thickness of an isolation region 62 over a portion of the crown structure 51 having thickness T2 may be greater than or about the same as a thickness of an isolation region 62 over a portion of the crown structure 51 having thickness T1 (see FIG. 3B). In some embodiments, a thickness of an isolation region 62 over a portion of the recessed substrate 50 may be greater than or about the same as about 60 nm. In some embodiments, a thickness of an isolation region 62 over a portion of the crown structure 51 having thickness T1 may be greater than or about the same as about 50 nm. In some embodiments, a thickness of an isolation region 62 over a portion of the crown structure 51 having thickness T2 (see FIG. 3B) may be greater than or about the same as about 40 nm. In some embodiments, a distance between the bottom of the dielectric material 140 and the top of the adjacent isolation region 62 is about the same or greater than the thickness of that adjacent isolation region 62.

Embodiments may achieve advantages. By forming the replacement metal gate before forming the metal gate cut, the deposition of the metal gate may be improved. A metal gate cut can create narrow regions (for example, between a fin and a metal gate cut) that may be problematic for subsequent deposition to fill or cover, and thus forming the metal gate cut after the metal gate can reduce the number of these problematic regions. For example, using the techniques described herein, the deposition of the work-function layer, barrier layer, or gate fill may be more uniform and have greater filling efficiency, particularly in the region of a metal gate cut. In this manner, process defects may be reduced and device performance may be enhanced.

In an embodiment, a method includes forming a first semiconductor fin and a second semiconductor fin in a substrate, the first semiconductor fin adjacent the second semiconductor fin, forming a dummy gate structure extending over the first semiconductor fin and the second semiconductor fin, depositing a first dielectric material surrounding the dummy gate structure, replacing the dummy gate structure with a first metal gate structure, performing an etching process on the first metal gate structure and on the first dielectric material to form a first recess in the first metal gate structure and a second recess in the first dielectric material, wherein the first recess extends into the substrate, and wherein the second recess is disposed between the first semiconductor fin and the second semiconductor fin, and depositing a second dielectric material within the first recess. In an embodiment, the etching process forms a recess including the first recess and the second recess. In an embodiment, a depth of the first recess is greater than a depth of the second recess. In an embodiment, a depth of the second recess is less than a thickness of the first dielectric material. In an embodiment, the etching process includes an atomic layer etching (ALE) process. In an embodiment, the second dielectric material includes silicon nitride (SiN). In an embodiment, the method includes depositing the second dielectric material within the second recess. In an embodiment, the method includes forming a third dielectric material over the first dielectric material, wherein after forming the third dielectric material, a portion of the second dielectric material remains in the second recess. In an embodiment, the first recess has a first width at the top of the first recess that is greater than a second width at the bottom of the first recess.

In an embodiment, a method of forming a semiconductor device includes forming a fin over a semiconductor substrate, forming a metal gate structure extending over the fin, wherein the metal gate structure is surrounded by a first dielectric material, forming a patterned hard mask layer over the metal gate structure and the first dielectric material, wherein an opening of the patterned hard mask layer extends from a first region directly over the metal gate structure to a second region directly over the first dielectric material, etching a portion of the metal gate structure in the first region and a portion of the first dielectric material in the second region using the same etching process, wherein the etching process forms a recess in the metal gate structure and the first dielectric material, wherein the recess has a first depth in the first region that is greater than a second depth of the recess in the second region, wherein etching the portion of the metal gate structure in the first region exposes the semiconductor substrate, and filling the recess with an insulating material. In an embodiment, the method includes forming a second dielectric material over the first dielectric material and the insulating material within the recess. In an embodiment, the insulating material is silicon nitride (SiN). In an embodiment, forming the metal gate structure includes forming a gate dielectric layer, a work-function layer, and a gate fill material, and wherein the gate dielectric layer, the work-function layer, and the gate fill material physically contact the insulating material. In an embodiment, the method includes performing an etching process to etch a contact opening into the first dielectric material and into the insulating material in the second region, wherein a portion of the insulating material remains in the second region after the etching process. In an embodiment, the recess has an aspect ratio between 7:1 and 18:1. In an embodiment, the method includes forming a third dielectric material over the semiconductor substrate, wherein the metal gate structure is formed over the third dielectric material, and wherein the recess extends through the third dielectric material.

In an embodiment, a device includes a semiconductor substrate, a first fin over the semiconductor substrate, a second fin over the semiconductor substrate, wherein the second fin is adjacent the first fin, an interlayer dielectric (ILD) surrounding the first fin and the second fin including a first dielectric material, a first gate structure extending over the first fin, wherein the first gate structure includes a first gate dielectric material and a first gate fill material, a second gate structure extending over the second fin, wherein the second gate structure includes a second gate dielectric material and a second gate fill material, and a second isolation region between the first gate structure and the second gate structure, wherein the second isolation region extends into the semiconductor substrate, wherein the first gate dielectric material and the first gate fill material physically contact a first sidewall of the second isolation region, wherein the second gate dielectric material and the second gate fill material physically contact a second sidewall of the second isolation region that is opposite the first sidewall, wherein the second isolation region extends into the ILD, and wherein the second isolation region includes a second dielectric material. In an embodiment, the semiconductor substrate includes a raised portion, wherein the first fin and the second fin are disposed over the raised portion of the semiconductor substrate. In an embodiment, a bottom surface of the second isolation region is between 0 nm and 30 nm below a top surface of the semiconductor substrate. In an embodiment, the second isolation region has a height:width ratio between 7:1 and 18:1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate comprising a first fin and a second fin;
   a first dielectric layer over the substrate, the first dielectric layer being between the first fin and the second fin, the first fin and the second fin protruding above the first dielectric layer;
   a first gate structure over a first channel region of the first fin;
   a second gate structure over a second channel region of the second fin, wherein a first cross-section extends through the first gate structure and the second gate structure;
   a first source/drain region over the first fin adjacent the first gate structure;
   a second source/drain region over the second fin adjacent the second gate structure, wherein a second cross-section is parallel to the first cross-section, wherein the second cross-section extends through the first source/drain region and the second source/drain region;
a second dielectric layer over the first dielectric layer, the second dielectric layer extending along opposing sidewalls of the first gate structure and along opposing sidewalls of the second gate structure; and
an isolation structure between the first gate structure and the second gate structure, wherein the isolation structure extends into the second dielectric layer in the second cross-section, wherein the isolation structure extends through the first gate structure and into the first dielectric layer in the first cross-section, wherein the isolation structure does not extend into the first dielectric layer in the second cross-section.

2. The semiconductor device of claim 1, wherein the isolation structure extends into the substrate in the first cross-section.

3. The semiconductor device of claim 1, further comprising a source/drain contact in the second dielectric layer, wherein the source/drain contact contacts the first source/drain region and the second source/drain region, wherein the isolation structure extends across an interface between the source/drain contact and the second dielectric layer in the second cross-section.

4. The semiconductor device of claim 3, wherein the isolation structure extends into the source/drain contact a distance between 0 nm and 20 nm in the second cross-section.

5. The semiconductor device of claim 3, wherein the isolation structure extends into the second dielectric layer a distance between 0 nm and 70 nm.

6. The semiconductor device of claim 3, wherein the source/drain contact extends above the isolation structure a distance between 30 nm and 80 nm.

7. The semiconductor device of claim 1, wherein the isolation structure between the first gate structure and the second gate structure has a height:width ratio between 7:1 and 18:1.

8. A semiconductor device comprising:
a first fin and a second fin protruding from a substrate;
a first dielectric layer over the substrate, the first dielectric layer being interposed between the first fin and the second fin;
a first gate structure over a first channel region of the first fin, the first gate structure comprising a first gate dielectric layer and a first gate electrode;
a second gate structure over a second channel region of the second fin, the second gate structure comprising a second gate dielectric layer and a second gate electrode;
a second dielectric layer over the first dielectric layer, the second dielectric layer extending along opposing sidewalls of the first gate structure and along opposing sidewalls of the second gate structure; and
an isolation structure directly contacting the first gate electrode of the first gate structure and the second gate electrode of the second gate structure, wherein a first portion of the isolation structure completely separates the first gate structure and the second gate structure, wherein a second portion of the isolation structure extends partially through the second dielectric layer, wherein a depth of the first portion is greater than a depth of the second portion.

9. The semiconductor device of claim 8, wherein an upper surface of the isolation structure is level with an upper surface of the second dielectric layer.

10. The semiconductor device of claim 8, further comprising:
a first source/drain region over the first fin;
a second source/drain region over the second fin; and
a source/drain contact in the second dielectric layer, the source/drain contact electrically contacting the first source/drain region and the second source/drain region, wherein the isolation structure extends into a bottom of the source/drain contact.

11. The semiconductor device of claim 10, wherein an upper surface of the isolation structure is recessed below an upper surface of the second dielectric layer.

12. The semiconductor device of claim 10, wherein the isolation structure extends into the first dielectric layer.

13. The semiconductor device of claim 12, wherein the isolation structure extends into the substrate.

14. The semiconductor device of claim 8, wherein the isolation structure directly contacts the first gate dielectric layer.

15. A semiconductor device comprising:
a semiconductor substrate;
a first fin over the semiconductor substrate;
a second fin over the semiconductor substrate;
an interlayer dielectric (ILD) surrounding the first fin and the second fin, the ILD comprising a first dielectric material;
a first gate structure extending over the first fin, wherein the first gate structure comprises a first gate dielectric material and a first gate fill material;
a second gate structure extending over the second fin, wherein the second gate structure comprises a second gate dielectric material and a second gate fill material; and
an isolation line between the first gate structure and the second gate structure, wherein the isolation line extends into the ILD, wherein the isolation line has a first thickness between the first gate structure and the second gate structure, wherein the isolation line has a second thickness in the ILD, wherein the first thickness is greater than the second thickness, wherein the first thickness and the second thickness extends from a top surface of the isolation line to a bottom surface of the isolation line along a sidewall of the isolation line, and wherein the isolation line comprises a second dielectric material.

16. The semiconductor device of claim 15, wherein an upper surface of the isolation line between the first gate structure and the second gate structure is level with an upper surface of the ILD.

17. The semiconductor device of claim 16, further comprising a source/drain contact, wherein the source/drain contact extends over the isolation line in a cross-section view.

18. The semiconductor device of claim 15, further comprising a source/drain contact, wherein isolation line contacts the first gate fill material and the source/drain contact.

19. The semiconductor device of claim 15, wherein the isolation line extends from an upper surface of the first gate structure into the semiconductor substrate.

20. The semiconductor device of claim 15, wherein the semiconductor substrate comprises a raised base, wherein the first fin and the second fin protrude from the raised base.

* * * * *